United States Patent [19]

Funaki

[11] Patent Number: 5,463,237
[45] Date of Patent: Oct. 31, 1995

[54] MOSFET DEVICE HAVING DEPLETION LAYER

[75] Inventor: Masaki Funaki, Yokohama, Japan

[73] Assignee: Victor Company of Japan, Ltd., Yokohama, Japan

[21] Appl. No.: 335,409

[22] Filed: Nov. 3, 1994

[30] Foreign Application Priority Data

| Nov. 4, 1993 | [JP] | Japan | 5-298972 |
| Nov. 9, 1993 | [JP] | Japan | 5-303367 |
| Nov. 24, 1993 | [JP] | Japan | 5-315810 |
| Nov. 24, 1993 | [JP] | Japan | 5-315811 |

[51] Int. Cl.$^6$ .......................... H01L 29/78; H01L 27/02
[52] U.S. Cl. .................. 257/336; 257/339; 257/344; 257/408; 257/409
[58] Field of Search ........................ 257/204, 335, 257/336, 344, 362, 408, 409, 497, 339

[56] References Cited

U.S. PATENT DOCUMENTS

| 4,819,043 | 4/1989 | Yazawa et al. | 257/408 |
| 4,916,500 | 4/1990 | Yazawa et al. | 257/408 |
| 5,060,033 | 10/1991 | Takeuchi | 257/409 |

FOREIGN PATENT DOCUMENTS

| 1-208869 | 8/1989 | Japan | 257/344 |
| 3-116936 | 5/1991 | Japan | 257/336 |
| 4-346272 | 12/1992 | Japan | 257/408 |

Primary Examiner—William Mintel
Assistant Examiner—Minhloan Tran
Attorney, Agent, or Firm—Pollack, Vande Sande & Priddy

[57] ABSTRACT

A semiconductor device includes a substrate having a first conduction type. A gate insulating film is provided on the substrate. A gate electrode is formed on the gate insulating film. A source region provided on the substrate has a second conduction type different from the first conduction type. A drain region provided on the substrate has the second conduction type. The source region and the drain region extend below the gate insulating film, and are located at respective sides of the gate electrode. A first region provided on the substrate has the first conduction type and extends below the gate insulating film. A second region provided on the substrate has the second conduction type, and extends below the first region. The second region connects with the first region via a pn junction. Third regions provided on the substrate have the first conduction type, and connect with the second region via respective pn junctions. A first one of the third regions extends between the second region and the source region. A second one of the third regions extends between the second region and the drain region. The first region has a depth-direction width which is smaller than a sum of a depth-direction width of a depletion layer caused by the pn junction with the second region and a depth-direction width of a depletion layer caused by application of a voltage to the gate electrode. Third regions have a lateral-direction width which is greater than a sum of a lateral-direction width of a depletion layer caused by the source region and a lateral-direction width of a depletion layer caused by the pn junctions with the second region.

7 Claims, 25 Drawing Sheets

SAMPLE NUMBER : 21

SAMPLE NUMBER : 21

SAMPLE NUMBER : 19

SAMPLE NUMBER : 19

MOSFET DEVICE HAVING DEPLETION LAYER

BACKGROUND OF THE INVENTION

1. Field of the Invention

This invention generally relates to a semiconductor device and a method of fabricating the same. This invention particularly relates to a MOSFET (metal-oxide-semiconductor field-effect transistor) and a method of fabricating the same.

2. Description of the Prior Art

A typical MOSFET has a substrate formed with a source region, a channel region, and a drain region. The channel region extends between the source region and the drain region. A gate insulating film made of an oxide extends on the source region, the channel region, and the drain region. A gate electrode is formed on an area of the gate insulating film which extends directly above the channel region.

As the MOSFET is scaled down or miniaturized, the distance between the source region and the drain region decreases. Such a decreased distance easily causes the punch through phenomenon, that is, the establishment of conduction (continuity) between the source region and the drain region. An effective way of preventing the punch through phenomenon is to increase the concentration of impurities in the substrate.

In the presence of a gate voltage, an increased concentration of impurities in the substrate reduces the width of a depletion layer below the gate electrode so that the intensity of a perpendicular (vertical) electric field at the boundary with the gate insulting film increases. The increased intensity of the electric field decreases the mobility of carriers, and thus lowers the transistor performance.

As the MOSFET is scaled down or miniaturized, the rating power supply voltage applied thereto tends to decrease. The decreased power supply voltage requires a lowered transistor threshold voltage. When the concentration of impurities in the substrate is increased as previously described, the threshold voltage rises. It is known that the threshold voltage can be decreased by introducing new impurities, corresponding to a conduction type opposite to the conduction type concerning the original impurities, into a surface portion of the substrate.

In cases where new impurities are introduced into the substrate as indicated above, the drain current (leak current) which occurs at a gate voltage of 0 volt increases although the threshold voltage drops.

An increased concentration of impurities in the substrate reduces the widths of depletion layers below the source region and the drain region, so that the capacitances related to the source region and the drain region increase. As a result of the increase in the capacitances, the delay time in transistor operation lengthens and the transistor operation speed drops.

SUMMARY OF THE INVENTION

It is a first object of this invention to provide an improved semiconductor device.

It is a second object of this invention to provide a method of fabricating an improved semiconductor device.

A first aspect of this invention provides a semiconductor device comprising a substrate having a first conduction type: a gate insulating film provided on the substrate; a gate electrode formed on the gate insulating film; a source region provided on the substrate and having a second conduction type different from the first conduction type; a drain region provided on the substrate and having the second conduction type; wherein the source region and the drain region extend below the gate insulating film and are located at respective sides of the gate electrode; a first region provided on the substrate and having the first conduction type, the first region extending below the gate insulating film; a second region provided on the substrate and having the second conduction 15 type, the second region extending below the first region and being separated from the gate insulating film by the first region, the second region connecting with the first region via a pn junction; and third regions provided on the substrate and having the first conduction type, the third regions connecting with the second region via respective pn junctions, wherein a first one of the third regions extends between the second region and the source region and separates the second region from the source region, and a second one of the third regions extends between the second region and the drain region and separates the second region from the drain region; wherein the first region has a depth-direction width which is smaller than a sum of a depth-direction width of a depletion layer caused by the pn junction with the second region and a depth-direction width of a depletion layer caused by application of a voltage to the gate electrode, and wherein the third regions have a lateral-direction width which is greater than a sum of a lateral-direction width of a depletion layer caused by the source region and a width of a depletion layer caused by the pn junctions with the second region.

A second aspect of this Invention provides a method of fabricating a semiconductor device which comprises the steps of preparing a semiconductor substrate having a first conduction type; introducing impurities corresponding to the first conduction type into the substrate to form a first region; introducing impurities corresponding to a second conduction type into the substrate to form a second region, the second conduction type differing from the first conduction type, the second region being more distant from a surface of the substrate than the first region is; forming a gate insulating film on the Surface of the substrate; forming a gate electrode on the gate insulating film; introducing impurities corresponding to the first conduction type into a portion of the substrate to form a third region while using the gate electrode as a mask, wherein at least a part of the portion of the substrate overlaps a portion of the second region, and an impurity concentration in the third region is higher than an impurity concentration in the second region; and introducing impurities corresponding to the second conduction type into the substrate to form a source region and a drain region while using the gate electrode as a mask.

A third aspect of this invention provides a semiconductor device comprising a substrate having a first conduction type; a gate insulating film provided on the substrate; a gate electrode formed on the gate insulating film; a source region provided on the substrate and having a second conduction type different from the first conduction type; a drain region provided on the substrate and having the second conduction type; wherein the source region and the drain region extend below the gate insulating film and are located at respective sides of the gate electrode; a first region provided on the substrate and having the first conduction type, the first region extending below the gate insulating film; a second region provided on the substrate and having the second conduction type, the second region extending below the first region and being separated from the gate insulating film by the first region, the second region connecting with the first region via a pn junction; third regions provided on the substrate and having the first conduction type, the third regions connecting with the second region via respective pn junctions, wherein a first one of the third regions extends between the second region and the source region and separates the second region from the source region, and a second one of the third regions extends between the second region and the drain region and separates the second region from the drain region; a fourth region formed by the substrate; and fifth regions provided on the substrate and having the second conduction type, the fifth regions having an impurity concentration lower than an impurity concentration in the source region and the drain region, wherein a first one of the fifth regions extends between the fourth region and the source region, and a second one of the fifth regions extends between the fourth region and the drain region; wherein the first region has a depth-direction width which is smaller than a sum of a depth-direction width of a depletion layer caused by the pn junction with the second region and a depth-direction width of a depletion layer caused by application of a voltage to the gate electrode, and wherein the third regions have a lateral-direction width which is greater than a sum of a lateral-direction width of a depletion layer caused by the drain region and a lateral-direction width of a depletion layer caused by the pn junctions with the second region.

A fourth aspect of this invention provides a method of fabricating a semiconductor device which comprises the steps of preparing a semiconductor substrate having a first conduction type; introducing impurities corresponding to the first conduction type into the substrate to form a first region; introducing impurities corresponding to a second conduction type into the substrate to form a second region, the second conduction type differing from the first conduction type, the second region being more distant from a surface of the substrate than the first region is; forming a gate insulating film on the surface of the substrate; forming a gate electrode on the gate insulating film; forming a resist which covers predetermined areas on the substrate; introducing impurities corresponding to the first conduction type into a portion of the substrate to form a third region while using the gate electrode and the resist as a mask, wherein at least a part of the portion of the substrate overlaps a portion of the second region, and an impurity concentration in the third region is higher than an impurity concentration in the second region; removing the resist; and introducing impurities corresponding to the second conduction type into the substrate to form a source region and a drain region while using the gate electrode as a mask.

A fifth aspect of this invention provides a semiconductor device comprising a substrate having a first conduction type; a gate insulating film provided on the substrate; a gate electrode formed on the gate insulating film; a source region provided on the substrate and having a second conduction type different from the first conduction type; a drain region provided on the substrate and having the second conduction type; wherein the source region and the drain region extend below the gate insulating film and are located at respective sides of the gate electrode; a first region provided on the substrate and having the first conduction type, the first region extending below the gate insulating film; a second region provided on the substrate and having the second conduction type, the second region extending below the first region and being separated from the gate insulating film by the first region, the second region connecting with the first region via a pn junction; third regions provided on the substrate and having the first conduction type, the third regions connecting with the second region via respective pn junctions, wherein a first one of the third regions extends between the second region and the source region and separates the second region from the source region, and a second one of the third regions extends between the second region and the drain region and separates the second region from the drain region; and a fourth region formed by the substrate and connecting with the second region via a pn junction; wherein the first region has a depth-direction width which is smaller than a sum of a depth-direction width of a depletion layer caused by the pn junction with the second region and a depth-direction width of a depletion layer caused by application of a voltage to the gate electrode, wherein the second region has a depth-direction width which is smaller than a sum of a depth-direction width of a depletion layer caused in the second region by the pn junction with the first region and a depth-direction width of a depletion layer caused by the pn junction with the fourth region, and wherein the third regions have a lateral-direction width which is greater than a sum of a lateral-direction width of a depletion layer caused by the source region and a lateral-direction width of a depletion layer caused by the pn junctions with the second region.

A sixth aspect of this invention provides a semiconductor device comprising a substrate having a first conduction type; a gate insulating film provided on the substrate; a gate electrode formed on the gate insulating film; a source region provided on the substrate and having a second conduction type different from the first conduction type; a drain region provided on the substrate and having the second conduction type; wherein the source region and the drain region extend below the gate insulating film and are located at respective sides of the gate electrode; a first region provided on the substrate and having the first conduction type, the first region extending below the gate insulating film; a second region provided on the substrate and having the second conduction type, the second region extending below the first region and being separated from the gate insulating film by the first region, the second region connecting with the first region via a pn junction; third regions provided on the substrate and having the first conduction type, the third regions connecting with the second region via respective pn junctions, wherein a first one of the third regions extends between the second region and the source region and separates the second region from the source region, and a second one of the third regions extends between the second region and the drain region and separates the second region from the drain region; and LDD regions provided on the substrate and having the second conduction type, the LDD regions having an impurity concentration lower than an impurity concentration in the source region and the drain region, wherein a first one of the LDD regions extends between the first region and the source region, and a second one of the LDD regions extends between the first region and the drain region; wherein the first region has a depth-direction width which is smaller than a sum of a depth-direction width of a depletion layer caused by the pn junction with the second region and a depth-direction width of a depletion layer caused by application of a voltage to the gate electrode, and wherein the third regions have a lateral-direction width which is greater than a sum of a lateral-direction width of a depletion layer caused by the drain region and a lateral-direction width of a depletion layer caused by the pn junctions with the second region.

A seventh aspect of this invention provides a semiconductor device comprising a substrate having a first conduction type; a gate insulating film provided on the substrate; a gate electrode formed on the gate insulating film; a source region provided on the substrate and having a second conduction type different from the first conduction type; a drain region provided on the substrate and having the second conduction type; wherein the source region and the drain region extend below the gate insulating film and are located at respective sides of the gate electrode; a first region provided on the substrate and having the first conduction type, the first region extending below the gate insulating film; a second region provided on the substrate and having the second conduction type, the second region extending below the first region and being separated from the gate insulating film by the first region, the second region connecting with the first region via a pn junction; third regions provided on the substrate and having the first conduction type, the third regions connecting with the second region via respective pn junctions, wherein a first one of the third regions extends between the second region and the source region and separates the second region from the source region, and a second one of the third regions extends between the second region and the dram region and separates the second region from the drain region; a second insulating film provided on the substrate and surrounding an area containing the gate insulating film, the gate electrode, the source region, the drain region, the first region, the second region, and the third regions to provide an isolation from a neighboring device; and a fourth region provided on the substrate and extending between the first region and the second insulating film, the fourth region having a conductivity higher than a conductivity of the first region; wherein the first region has a depth-direction width which is smaller than a sum of a depth-direction width of a depletion layer caused by the pn junction with the second region and a depth-direction width of a depletion layer caused by application of a voltage to the gate electrode, and wherein the third regions have a lateral-direction width which is greater than a sum of a lateral-direction width of a depletion layer caused by the drain region and a lateral-direction width of a depletion layer caused by the pn junctions with the second region.

An eighth aspect of this invention provides a method of fabricating a semiconductor device which comprises the steps of preparing a substrate having a first conduction type; providing a gate insulating film on the substrate; forming a gate electrode on the gate insulating film; providing a source region on the substrate, the second region having a second conduction type different from the first conduction type; providing a drain region on the substrate, the drain region having the second conduction type; wherein the source region and the drain region extend below the gate insulating film and are located at respective sides of the gate electrode; providing a first region on the substrate, the first region having the first conduction type and extending below the gate insulating film; providing a second region on the substrate, the second region having the second conduction type and extending below the first region, the second region being separated from the gate insulating film by the first region and connecting with the first region via a pn junction; providing third regions on the substrate, the third regions having the first conduction type and connecting with the second region via respective pn junctions, wherein a first one of the third regions extends between the second region and the source region and separates the second region from the source region, and a second one of the third regions extends between the second region and the drain region and separates the second region from the drain region; providing a second insulating film on the substrate, the second insulating film surrounding an area containing the gate insulating film, the gate electrode, the source region, the drain region, the first region, the second region, and the third regions to provide an isolation from a neighboring device; and providing a fourth region on the substrate, the fourth region extending between the first region and the second insulating film and having a conductivity higher than a conductivity of the first region; wherein the first region has a depth-direction width which is smaller than a sum of a depth-direction width of a depletion layer caused by the pn junction with the second region and a depth-direction width of a depletion layer caused by application of a voltage to the gate electrode, and wherein the third regions have a lateral-direction width which is greater than a sum of a lateral-direction width of a depletion layer caused by the drain region and a lateral-direction width of a depletion layer caused by the pn junctions with the second region; wherein the fourth-region providing step comprises introducing impurities corresponding to the first conduction type into the substrate to form the fourth region before the second insulating film is formed.

A ninth aspect of this invention provides a method of fabricating a semiconductor device which comprises the steps of preparing a substrate having a first conduction type; providing a gate insulating film on the substrate; forming a gate electrode on the gate insulating film; providing a source region on the substrate, the second region having a second conduction type different from the first conduction type; providing a drain region on the substrate, the drain region having the second conduction type; wherein the source region and the drain region extend below the gate insulating film and are located at respective sides of the gate electrode; providing a first region on the substrate, the first region having the first conduction type and extending below the gate insulating film; providing a second region on the substrate, the second region having the second conduction type and extending below the first region, the second region being separated from the gate insulating film by the first region and connecting with the first region via a pn junction; providing third regions on the substrate, the third regions having the first conduction type and connecting with the second region via respective pn junctions, wherein a first one of the third regions extends between the second region and the source region and separates the second region from the source region, and a second one of the third regions extends between the second region and the drain region and separates the second region from the drain region; providing a second insulating film on the substrate, the second insulating film surrounding an area containing the gate insulating film, the gate electrode, the source region, the drain region, the first region, the second region, and the third regions to provide an isolation from a neighboring device; and providing a fourth region on the substrate, the fourth region extending between the first region and the second insulating film and having a conductivity higher than a conductivity of the first region; wherein the first region has a depth-direction width which is smaller than a sum of a depth-direction width of a depletion layer caused by the pn junction with the second region and a depth-direction width of a depletion layer caused by application of a voltage to the gate electrode, and wherein the third regions have a lateral-direction width which is greater than a sum of a lateral-direction width of a depletion layer caused by the drain region and a lateral-direction width of a depletion layer caused by the pn junctions with the second region; wherein the fourth-region providing step comprises introducing impurities corresponding to the first conduction type into the substrate near the second insulating film to form the fourth region after the second insulating film, the first region, and the second region are formed.

A tenth aspect of this invention provides a method of fabricating a semiconductor device which comprises the steps of preparing a substrate having a first conduction type; providing a gate insulating film on the substrate; forming a gate electrode on the gate insulating film; providing a source region on the substrate, the second region having a second conduction type different from the first conduction type; providing a drain region on the substrate, the drain region having the second conduction type; wherein the source region and the drain region extend below the gate insulating film and are located at respective sides of the gate electrode; providing a first region on the substrate, the first region having the first conduction type and extending below the gate insulating film; providing a second region on the substrate, the second region having the second conduction type and extending below the first region, the second region being separated from the gate insulating film by the first region and connecting with the first region via a pn junction; providing third regions on the substrate, the third regions having the first conduction type and connecting with the second region via respective pn junctions, wherein a first one of the third regions extends between the second region and the source region and separates the second region from the source region, and a second one of the third regions extends between the second region and the drain region and separates the second region from the drain region; providing a second insulating film on the substrate, the second insulating film surrounding an area containing the gate insulating film, the gate electrode, the source region, the drain region, the first region, the second region, and the third regions to provide an isolation from a neighboring device; and providing a fourth region on the substrate, the fourth region extending between the first region and the second insulating film and having a conductivity higher than a conductivity of the first region; wherein the first region has a depth-direction width which is smaller than a sum of a depth-direction width of a depletion layer caused by the pn junction with the second region and a depth-direction width of a depletion layer caused by application of a voltage to the gate electrode, and wherein the third regions have a lateral-direction width which is greater than a sum of a lateral-direction width of a depletion layer caused by the drain region and a lateral-direction width of a depletion layer caused by the pn junctions with the second region; wherein the second-region providing step comprises providing a mask on the substrate near the second insulating film after the second insulating film and the first region are formed, and introducing impurities corresponding to the second conduction type into the substrate to form the second region while using the mask.

BRIEF DESCRIPTION OF THE DRAWINGS

FIGS. 25, 26, 27, 28, 29, 30, 31, and 32 are sectional diagrams of a semiconductor wafer in different states which occur during fabrication of the semiconductor device of FIG. 23.

DESCRIPTION OF THE PREFERRED EMBODIMENTS

First Embodiment

Figure 1:
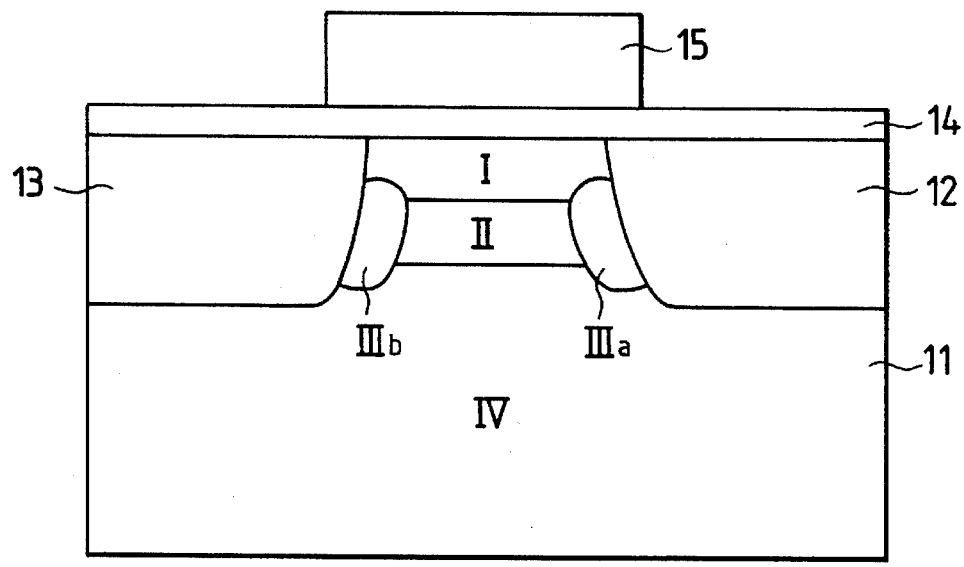
FIG. 1 is a sectional diagram of a semiconductor device according to a first embodiment of this invention.
Figure 2:
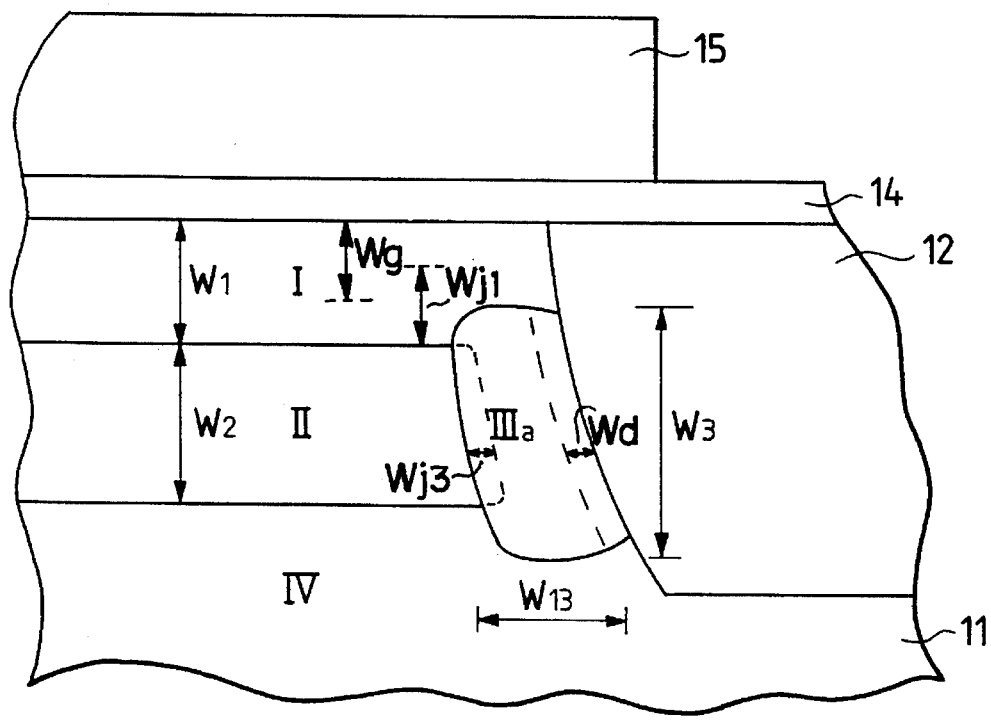
FIG. 2 is an enlarged view of a portion of FIG. 1.

With reference to FIGS. 1 and 2, a MOSFET (semiconductor device) includes a substrate 11 formed with a source region 12 and a drain region 13. The source region 12 and the drain region 13 are separated from each other by a plurality of regions I, II, IIIa, and IIIb extending on the substrate 11. The substrate 11 forms a region IV.

The region I is sandwiched between the source region 12 and the drain region 13. The region II extends immediately below a central area of the region I. The region II aligns with the region I along a depth direction (vertical direction). The region II is separated from the source region 12 and the drain region 13 by the regions IIIa and IIIb respectively. In other words, the region IIIa extends between the source region 12 and the region II while the region IIIb extends between the drain region 13 and the region II. The regions IIIa and IIIb extend immediately below edge portions of the region I. The region IV extends immediately below the region II, the regions IIIa and IIIb, the source region 12, and the drain region 13.

The source region 12, the region I, and the drain region 13 are coated with a gate insulating film 14 made of an oxide. In other words, the gate insulating film 14 extends immediately above the source region 12, the region I, and the drain region 13. A gate electrode 15 extends on the gate insulating film 14, and aligns with the region I along a vertical direction (depth direction). A central area of the gate electrode 15 is located directly above the region I. Edge areas of the gate electrode 15 are located directly above the source region 12 and the drain region 13 respectively.

The region IV, that is, the substrate 11, is of a first conduction type. The source region 12 and the drain region 13 are of a second conduction type opposite to the first conduction type. The region I is of the first conduction type. The region II is of the second conduction type. The region IIIa and IIIb are of the first conduction type. In cases where the substrate 11 or the region IV is of the p-type, the regions I, IIIa, and IIIb are of the p-type while the region II, the source region 12, and the drain region 13 are of the n-type. In cases where the substrate 11 or the region IV is of the n-type, the regions I, IIIa, and IIIb are of the n-type while the region II, the source region 12, and the drain region 13 are of the p-type.

A central portion of the region I has a width W1 along a depth direction. The presence of a gate bias provides a depletion layer, the width of which along the depth direction is denoted by Wg. The junction between the regions I and II provides a depletion layer, the width of which along the depth direction is denoted by Wj1. The depth-direction width W1 of the region I is set smaller than the sum of the depletion layer widths Wg and Wj1. Thus, there is a relation as "W1<Wg+Wj1".

The region II has a width W2 along the depth direction. The depth-direction width W2 of the region II may be set to an arbitrary value.

The regions IIIa and IIIb have a width W3 along the depth direction. The depth-direction width W3 of the regions IIIa and IIIb is set greater than the depth-direction width W2 of the region II. Thus, there is a relation as "W3>W2".

The regions IIIa and IIIb have a width W13 along a lateral direction (horizontal direction). Regarding the region II, the drain region 13 provides a depletion layer, the width of which along the lateral direction is denoted by Wd. The junctions among the regions II, IIIa, and IIIb provide depletion layers, the width of which along the lateral direction is denoted by Wj3. The lateral-direction width W13 of the regions IIIa and IIIb is set greater than the sum of the depletion layer widths Wd and Wj3. Thus, there is a relation as "W13>Wd+Wj3".

It is preferable that the impurity concentration (impurity density) N4 in the region IV is set smaller than the impurity concentrations N1, N2, and N3 in the respective regions I, II, and IIIa (and IIIb). Thus, there is a relation as "N4<N1, N2, N3".

During operation of the MOSFET, the region I undergoes an inversion and forms a channel region for conducting carriers. The threshold voltage of the MOSFET can be adjusted according to the impurity concentration in the region I.

The region II connects with the region I via a pn junction, which depletes the region I. Accordingly, when a given potential is applied to the gate electrode 15, the region II helps the region I to be depleted. Thus, the region II reduces a virtual capacitance as seen from the gate electrode 15. In addition, the region II decreases the threshold voltage of the MOSFET.

The region IIIb blocks the spread of a depletion layer from the drain region 13, thereby preventing the establishment of conduction (continuity) between the drain region 13 and the region II. The region IIIa blocks the spread of a depletion layer from the source region 12, thereby preventing the establishment of conduction (continuity) between the source region 12 and the region II. As a result, the regions IIIa and IIIb prevent the punch through phenomenon, that is, the establishment of conduction (continuity) between the source region 12 and the drain region 13. In addition, the regions IIIa and IIIb electrically connect the region I and the region IV with each other, and hence stabilizes a potential in the region I.

The impurity concentration in the region IV determines the capacitances of the source region 12 and the drain region 13. Since the prevention of the punch through phenomenon is implemented by the regions IIIa and IIIb, the impurity concentration in the region IV can be chosen without considering the prevention of the punch through phenomenon. It is preferable that the impurity concentration in the region IV is set to a small value to provide smaller capacitances of the source region 12 and the drain region 13.

Figure 3:
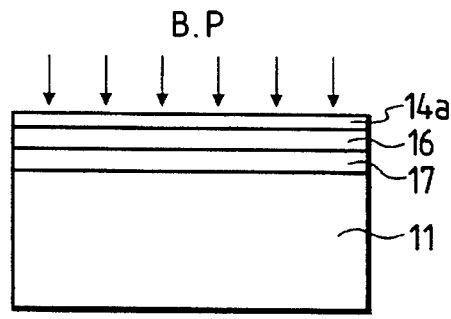
FIGS. 3, 4, 5, 6, and 7 are sectional diagrams of a semiconductor wafer in different states which occur during fabrication of the semiconductor device of FIG. 1.

The MOSFET of FIGS. 1 and 2 is fabricated as follows. With reference to FIG. 3, a p-type substrate 11 is prepared which will form a region IV. The substrate 11 has an impurity concentration (impurity density) of $1.5 \times 10^{16}$ cm$^{-3}$. A sacrifice oxide film 14a is formed on a surface of the substrate 11. Boron (B) ions are implanted into the substrate 11 via the sacrifice oxide film 14a while being accelerated at 25 KeV. The boron ion dose is equal to $1.5 \times 10^{12}$ cm$^{-2}$. In addition, phosphorus (P) ions are implanted into the substrate 11 via the sacrifice oxide film 14a while being accelerated at 160 KeV. The phosphorus ion dose is equal to $2.5 \times 10^{12}$ cm$^{-2}$. As a result, a B-doped layer 16 is formed immediately below the sacrifice oxide film 14a, and a P-doped layer 17 is formed immediately below the B-doped layer 16. A heating process on the implanted B and P ions will be executed later. The B-doped layer 16 and the P-doped layer 17 will form a region I and a region II respectively.

Figure 4:
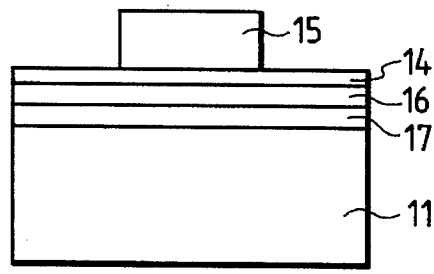

After the ion implantations, the sacrifice oxide film 14a is replaced by a gate insulating film 14 made of an oxide. A thin film of polycrystalline silicon is formed on the gate insulting film 14. As shown in FIG. 4, the polycrystalline silicon film is etched into a gate electrode 15.

Figure 5:
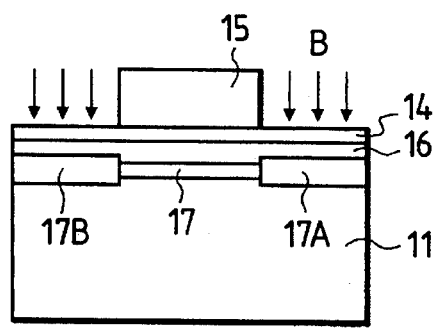

Subsequently, as shown in FIG. 5, while the gate electrode 15 is used as a mask, boron (B) ions are implanted via the gate insulating film 14 into regions 17A and 17B which contain the P-doped layer 17 and which extend into areas immediately above and below the P-doped layer 17 lying outward of the gate electrode 15. The boron ion dose related to the regions 17A and 17B is greater than the phosphorus ion dose related to the P-doped layer 17. A heating process on the implanted B ions will be executed later.

Figure 6:
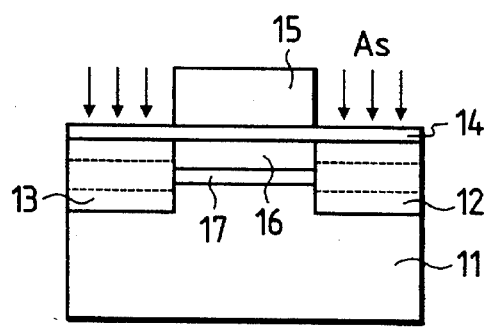

Then, as shown in FIG. 6, while the gate electrode 15 is used as a mask, arsenic (As) ions are implanted via the gate insulating film 14 into regions 12 and 13 which contain the regions 17A and 17B and the B-doped layer 16 and which extend into areas immediately below the regions 17A and 17B. The arsenic ion dose is greater than the boron ion dose. During a later stage, a heating process on the implanted arsenic ions will be executed to active the regions 12 and 13 into a source region and a drain region respectively.

Figure 7:
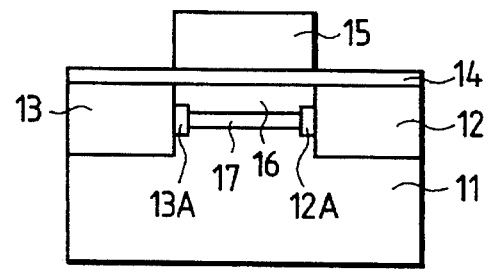

Subsequently, the substrate 11 with the previously-indicated regions is subjected to a heating process. During the heating process, boron ions having a greater diffusion coefficient than that of arsenic ions are diffused from the regions 17A and 17B into areas 12A and 13A which extend below the gate electrode 15 as shown in FIG. 7. The areas 12A and 13A form regions IIIa and IIIb (see FIG. 1) respectively. In addition, the regions 16 and 17 extending below the gate electrode 15 form regions I and II (see FIG. 1) respectively. The substrate 11 extending below the regions II, IIIa, and IIIb forms a region IV (see FIG. 1). The regions 12 and 13 change into a source region and a drain region respectively.

Second Embodiment

A second embodiment of this invention relates to another method of fabricating the MOSFET of FIGS. 1 and 2. The method according to the second embodiment is similar to the method in the first embodiment except for points indicated later.

Figure 8:
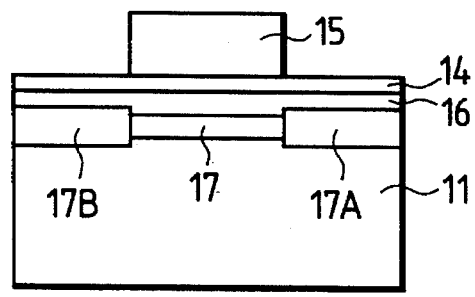
FIGS. 8, 9, and 10 are sectional diagrams of a semiconductor wafer in different states which occur during fabrication of a semiconductor device according to a second embodiment of this invention.
Figure 9:
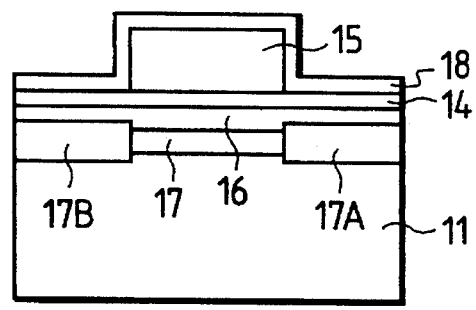

According to the second embodiment, as shown in FIG. 8, regions 17A and 17B are made by boron ion implantation similarly to the first embodiment. Then, as shown in FIG. 9, an insulating film 18 made of SiO$_2$ is formed on a gate insulating film 14 and a gate electrode 15 by CVD (chemical vapor deposition).

Figure 10:
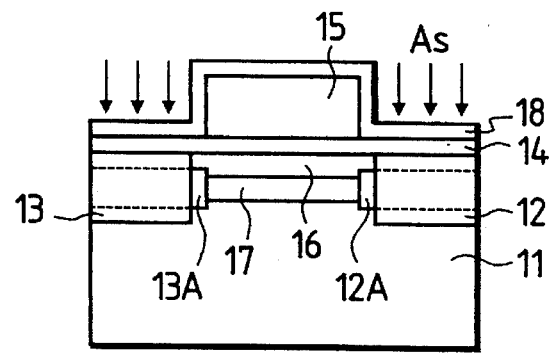

Subsequently, as shown in FIG. 10, while the gate electrode 15 and vertically-extending portions of the insulating film 18 are used as a mask, arsenic (As) ions are implanted via the gate insulating film 14 and horizontally-extending portions of the insulating film 18 into regions 12 and 13 which contain portions of the regions 17A and 17B and a B-doped layer 16 and which extend into areas immediately below the regions 17A and 17B. Since the vertically-extending portions of the insulating film 18 which adjoins sides of the gate electrode 15 serve as a mask during the arsenic ion implantation, the regions 12 and 13 are excluded from areas directly below the vertically-extending portions of the insulating film 18. Thus, portions of the regions 17A and 17B which extend directly below the vertically-extending portions of the insulating film 18 remain as regions 12A and 13A respectively.

Finally, a substrate 11 with the previously-indicated regions is subjected to a heating process. The regions 12 and 13 form a source region and a drain region respectively. The regions 12A and 13A form regions IIIa and IIIb (see FIG. 1) respectively. In addition, the regions 16 and 17 extending below the gate electrode 15 form regions I and II (see FIG. 1) respectively. The substrate 11 extending below the regions II, IIIa, IIIb, 12, and 13 forms a region IV (see FIG. 1).

The lateral-direction width W13 of the regions IIIa and IIIb (regions 12A and 13A) can be adjusted by controlling the thickness of the insulating film 18.

Third Embodiment

A third embodiment of this invention relates to still another method of fabricating the MOSFET of FIGS. 1 and 2. The method according to the third embodiment is similar to the method in the first embodiment except for points indicated later.

Figure 11:
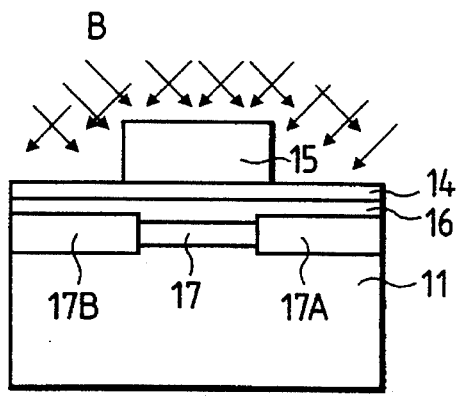
FIGS. 11 and 12 are sectional diagrams of a semiconductor wafer in different states which occur during fabrication of a semiconductor device according to a third embodiment of this invention.

According to the third embodiment, as shown in FIG. 11, a gate electrode 15 is formed on a gate insulating film 14 similarly to the first embodiment.

Subsequently, as shown in FIG. 11, while the gate electrode 15 is used as a mask, boron (B) ions are implanted along tilted directions via the gate insulating film 14 into regions 17A and 17B which contain a P-doped layer 17 and which extend into areas immediately above and below the P-doped layer 17 lying outward of a central portion of the gate electrode 15. As a result of the tilt ion implantation, the regions 17A and 17B extend into areas directly below outer edges of the gate electrode 15.

Figure 12:
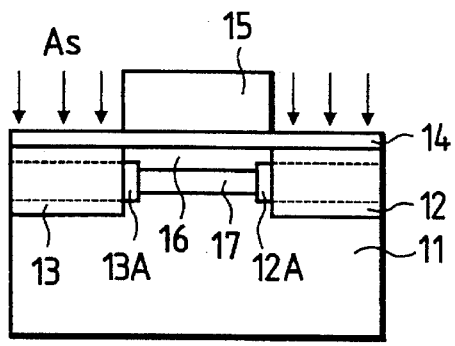

Then, as shown in FIG. 12, while the gate electrode 15 is used as a mask, arsenic (As) ions are implanted via the gate insulating film 14 into regions 12 and 13 which contain portions of the regions 17A and 17B and the B-doped layer 16 and which extend into areas immediately below the regions 17A and 17B. Since the arsenic ion implantation is not of the tilt type, the regions 12 and 13 are excluded from areas directly below the gate electrode 15. Thus, portions of the regions 17A and 17B which extend directly below the gate electrode 15 remain as regions 12A and 13A respectively.

Finally, a substrate 11 with the previously-indicated regions is subjected to a heating process. The regions 12 and 13 form a source region and a drain region respectively. The regions 12A and 13A form regions IIIa and IIIb (see FIG. 1) respectively. In addition, the regions 16 and 17 extending below the gate electrode 15 form regions I and II (see FIG. 1) respectively. The substrate 11 extending below the regions II, IIIa, IIIb, 12, and 13 forms a region IV (see FIG. 1).

The lateral-direction width W13 of the regions IIIa and IIIb (regions 12A and 13A) can be adjusted by controlling the tilt angles of the boron ion implantation.

Fourth Embodiment

Figure 13:
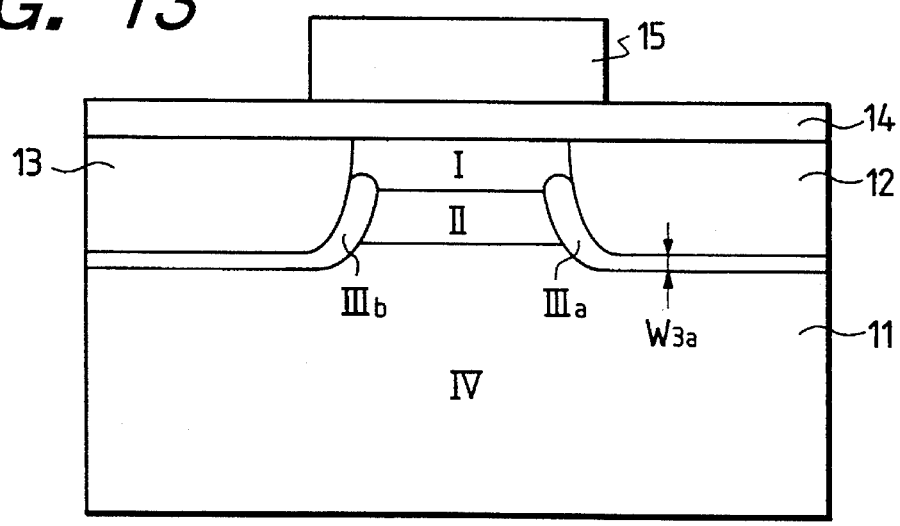
FIG. 13 is a sectional diagram of a semiconductor device according to a fourth embodiment of this invention.

FIG. 13 shows a fourth embodiment of this invention which is similar to the first embodiment (see FIGS. 1 and 2) except for design changes indicated later. In the embodiment of FIG. 13, regions IIIa and IIIb extend into lateral (horizontal) areas immediately below a source region 12 and a drain region 13 respectively.

The impurity concentration in the regions IIIa and IIIb which adjoin the source region 12 and the drain region 13 determines capacitances of the source region 12 and the drain region 13. In cases where the width W3a of the lateral portions of the regions IIIa and IIIb along a depth direction is smaller than the corresponding width of a drain depletion layer, the drain depletion layer reaches a region IV in a substrate 11 so that the capacitances of the source region 12 and the drain region 13 are reduced.

Fifth Embodiment

Figure 14:
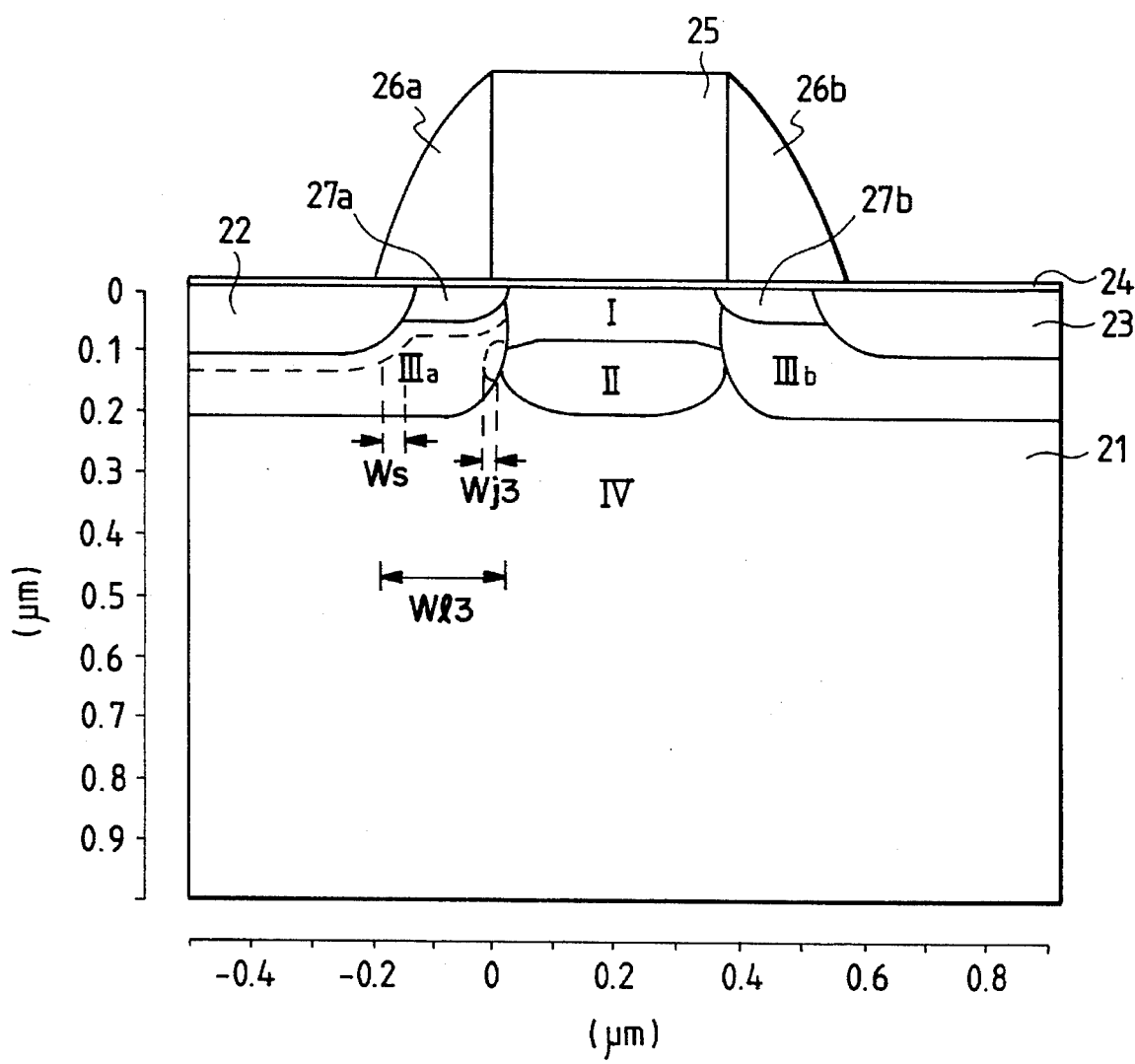
FIG. 14 is a sectional diagram of a semiconductor device according to a fifth embodiment of this invention.

With reference to FIG. 14, a MOSFET (semiconductor device) includes a substrate 21 formed with a source region 22 and a drain region 23. The source region 22 and the drain region 23 are separated from each other by a plurality of regions I, II, IIIa, IIIb, 27a, and 27b extending on the substrate 21. The substrate 21 forms a region IV. The regions 27a and 27b are designed to provide an LDD (lightly doped drain) structure.

The region I is sandwiched between the LDD regions 27a and 27b, and also between the regions IIIa and IIIb. The region II extends immediately below the region I, and aligns with the region I along a vertical direction (depth direction). The region II is separated from the source region 22 and the drain region 23 by the regions IIIa and IIIb respectively. In other words, the region IIIa extends between the source region 22 and the region II while the region IIIb extends between the drain region 23 and the region II. The LDD region 27a extends between the region I and the source region 22. The LDD region 27b extends between the region I and the drain region 23. The region IIIa extends immediately below the LDD region 27a and the source region 22. The region IIIb extends immediately below the LDD region 27b and the drain region 23. The region IV extends immediately below the region II and the regions IIIa and IIIb.

The source region 22, the region I, the drain region 23, and the LDD regions 27a and 27b are coated with a gate insulating film 24 made of an oxide. In other words, the gate insulating film 24 extends immediately above the source region 22, the region I, the drain region 23, and the LDD regions 27a and 27b. A gate electrode 25 extends on the gate insulating film 24, and aligns with the regions I and II along a vertical direction (depth direction). Nonconductive side spacers 26a and 26b provided on the gate insulating film 24 extend along opposite sides of the gate electrode 25 respectively. The LDD regions 27a and 27b are located below the side spacers 26a and 26b respectively.

The region IV, that is, the substrate 21, is of a first conduction type. The source region 22 and the drain region 23 are of a second conduction type opposite to the first conduction type. The region I is of the first conduction type. The region II is of the second conduction type. The region IIIa and IIIb are of the first conduction type. The LDD regions 27a and 27b are of the second conduction type. In cases where the substrate 21 or the region IV is of the p-type, the regions I, IIIa, and IIIb are of the p-type while the region II, the source region 22, the drain region 23, and the LDD regions 27a and 27b are of the n-type. In cases where the substrate 21 or the region IV is of the n-type, the regions I, IIIa, and IIIb are of the n-type while the region II, the source region 22, the drain region 23, and the LDD regions 27a and 27b are of the p-type.

A central portion of the region I has a width W1 along a depth direction. The presence of a gate bias provides a depletion layer, the width of which along the depth direction is denoted by Wg. The junction between the regions I and II provides a depletion layer, the width of which along the depth direction is denoted by Wj1. The depth-direction width W1 of the region I is set smaller than the sum of the depletion layer widths Wg and Wj1. Thus, there is a relation as "W1<Wg+Wj1".

The region II has a width W2 along the depth direction. The depth-direction width W2 of the region II may be set to an arbitrary value.

The regions IIIa and IIIb have a width W3 along the depth direction. It is preferable that the depth-direction width W3 of the regions IIIa and IIIb is set greater than the depth-direction width W2 of the region II. Thus, in this case, there is a relation as "W3>W2".

The regions IIIa and IIIb have a width W13 along a lateral direction (horizontal direction). Regarding the region II, the drain region 23 provides a depletion layer, the width of which along the lateral direction is denoted by Wd. The junctions among the regions II, IIIa, and IIIb provide depletion layers, the width of which along the lateral direction is denoted by Wj3. The lateral-direction width W13 of the regions IIIa and IIIb is set smaller than the sum of the depletion layer widths Wd and Wj3. Thus, there is a relation as "W13<Wd+Wj3". Regarding the region II, the source region 22 provides a depletion layer, the width of which along the lateral direction is denoted by Ws. As previously described, the junctions among the regions II, IIIa, and IIIb provide depletion layers, the width of which along the lateral direction is denoted by Wj3. The lateral-direction width W13 of the regions IIIa and IIIb is set greater than the sum of the depletion layer widths Ws and Wj3. Thus, there is a relation as "W13>Ws+Wj3".

In general, the presence of a drain voltage provides conditions where the width of a depletion layer caused by a drain region is greater than the width of a depletion layer caused by a source region 22. Accordingly, it is possible to simultaneously satisfy the previously-indicated relations as "W13<Wd+Wj3" and "W13>Ws+Wj3".

It is preferable that the impurity concentration (impurity density) N4 in the region IV is set smaller than the impurity concentrations N1, N2, and N3 in the respective regions I, II, and IIIa (and IIIb). Thus, there is a relation as "N4<N1, N2, N3".

During operation of the MOSFET, the region I undergoes an inversion and forms a channel region for conducting carriers. The threshold voltage of the MOSFET can be adjusted according to the impurity concentration in the region I.

The region II connects with the region I via a pn junction, which depletes the region I. Accordingly, when a given potential is applied to the gate electrode 25, the region II helps the region I to be depleted. Thus, the region II reduces a virtual capacitance as seen from the gate electrode 25. In addition, the region II decreases the threshold voltage of the MOSFET.

The region IIIb blocks the spread of a depletion layer from the drain region 23, thereby preventing the establishment of conduction (continuity) between the drain region 23 and the region II. The region IIIa blocks the spread of a depletion layer from the source region 22, thereby preventing the establishment of conduction (continuity) between the source region 22 and the region II. As a result, the regions IIIa and IIIb prevent the punch through phenomenon, that is, the establishment of conduction (continuity) between the source region 22 and the drain region 23. In addition, the regions IIIa and IIIb electrically connect the region I and the region IV with each other, and hence stabilizes a potential in the region I.

The impurity concentration in the region IV determines the capacitances of the source region 22 and the drain region 23. Since the prevention of the punch through phenomenon is implemented by the regions IIIa and IIIb, the impurity concentration in the region IV can be chosen without considering the prevention of the punch through phenomenon. It is preferable that the impurity concentration in the region IV is set to a small value to provide smaller capacitances of the source region 22 and the drain region 23.

Figure 15:
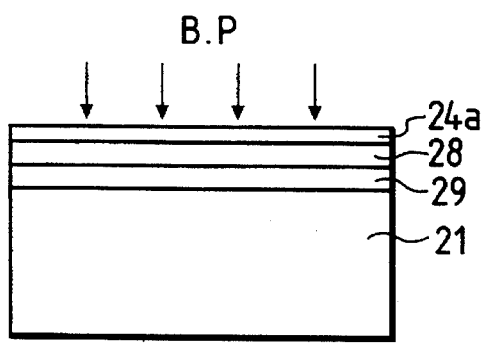
FIGS. 15, 16, 17, 18, 19, and 20 are sectional diagrams of a semiconductor wafer in different states which occur during fabrication of the semiconductor device of FIG. 14.

The MOSFET of FIG. 14 is fabricated as follows. With reference to FIG. 15, a p-type substrate 21 is prepared which will form a region IV. The substrate 21 has an impurity concentration (impurity density) of $1.5 \times 10^{16}$ cm$^{-3}$. A sacrifice oxide film 24a having a thickness of 500 angstroms is formed on a surface of the substrate 21. Boron (B) ions are implanted into the substrate 21 via the sacrifice oxide film 24a while being accelerated at 25 KeV. The boron ion dose is equal to $6.8 \times 10^{12}$ cm$^{-2}$. The boron ion dose may be equal to another value, for example, $4 \times 10^{12}$ cm$^{-2}$. In addition, phosphorus (P) ions are implanted into the substrate 21 via the sacrifice oxide film 24a while being accelerated at 105 KeV. The phosphorus ion dose is equal to $6.3 \times 10^{12}$ cm$^{-2}$. During the phosphorus ion implantation, the acceleration voltage (energy) may be equal to 120 KeV, and the phosphorus ion dose may be equal to another value. As a result, a B-doped layer 28 is formed immediately below the sacrifice oxide film 24a, and a P-doped layer 29 is formed immediately below the B-doped layer 28. A heating process on the implanted B and P ions will be executed later. The B-doped layer 28 and the P-doped layer 29 will form a region I and a region II respectively.

Figure 16:
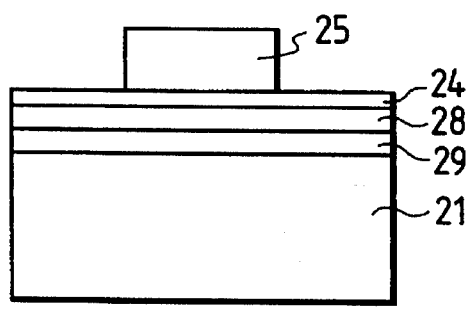

After the ion implantations, the sacrifice oxide film 24a is replaced by a gate insulating film 24 made of an oxide which has a thickness of 60 angstroms as shown in FIG. 16. A thin film of polycrystalline silicon is formed on the gate insulting film 24. As shown in FIG. 16, the polycrystalline silicon film is etched into a gate electrode 25 of an n-type which has a width of 0.4 μm.

Figure 17:
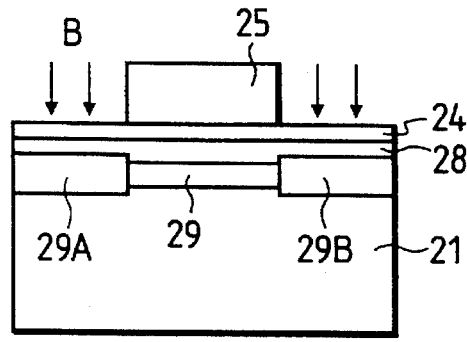

Subsequently, as shown in FIG. 17, while the gate electrode 25 is used as a mask, boron (B) ions are implanted via the gate insulating film 24 into regions 29A and 29B which contain the P-doped layer 29 and which extend into areas immediately above and below the P-doped layer 29 lying outward of the gate electrode 25. The boron ion implantation is executed under conditions where an acceleration potential is equal to 40 KeV and a dose is equal to $5.0 \times 10^{12}$ cm$^{-2}$. A heating process on the implanted boron ions will be executed later. Portions of the regions 29A and 29B will form regions IIIa and IIIb respectively.

Figure 18:
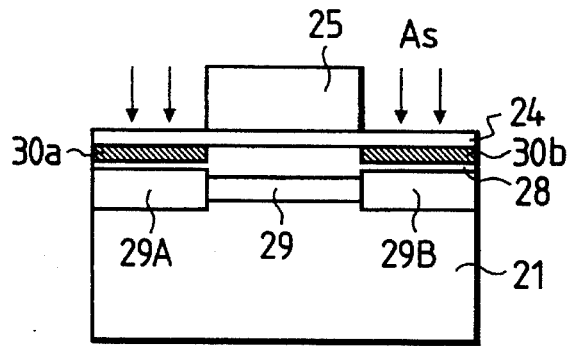

Then, as shown in FIG. 18, while the gate electrode 25 is used as a mask, arsenic (As) ions are implanted via the gate insulating film 24 into regions 30a and 30b in the B-doped layer 28 which extend immediately below the gate insulating film 24 lying outward of the gate electrode 25. The arsenic ion implantation is executed under conditions where an acceleration potential is equal to 25 KeV and a dose is equal to $4.0 \times 10^{13}$ cm$^{-2}$. A heating process on the implanted arsenic ions will be executed later. The regions 30a and 30b form layers of an n-type, portions of which will be LDD layers 27a and 27b respectively.

Figure 19:
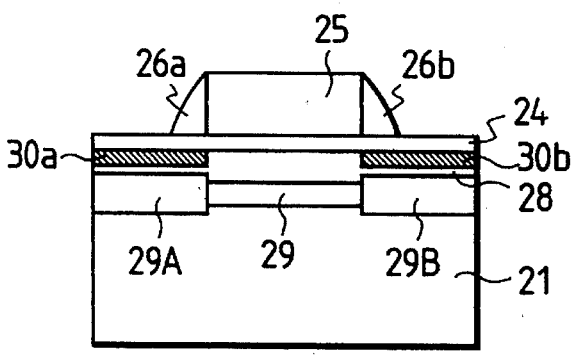

Subsequently, as shown in FIG. 19, side spacers 26a and 26b are formed along opposite sides of the gate electrode 25 respectively. The side spacers 26a and 26b extend on the gate insulating film 24, and have a width of 0.2 μm. Specifically, after the arsenic ion implantation, the substrate 21 with the above-indicated regions is coated with an SiO$_2$ film. The SiO$_2$ film is made into the side spacers 26a and 26b by an anisotropic etching process such as an RIE process.

Figure 20:
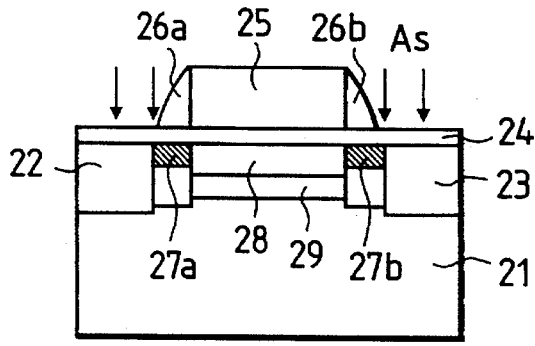

Then, as shown in FIG. 20, while the gate electrode 25 and the side spacers 26a and 26b are used as a mask, arsenic (As) ions are implanted via the gate insulating film 24 into regions 22 and 23 which contain the regions 30a, 30b, 28, 29A, and 29B lying outward of the gate electrode 25 and the side spacers 26a and 26b. The regions 22 and 23 extend immediately below the gate insulating film 24, and project into deeper portions of the substrate 21. The arsenic ion implantation is executed under conditions where an acceleration potential is equal to 50 KeV and a dose is equal to $1 \times 10^{15}$ cm$^{-2}$. During a later stage, a heating process on the implanted arsenic ions will be executed to activate the regions 22 and 23 into a source region and a drain region respectively.

Finally, the substrate 21 with the previously-indicated regions is subjected to a heating process at a temperature of 900° C. for 40 minutes so that the MOSFET of FIG. 14 is completed. The B-doped layer 28 remaining below the gate electrode 25 forms a region I (see FIG. 14). The P-doped layer 29 remaining below the gate electrode 25 forms a region II (see FIG. 14). The regions 29A and 29B remaining below the side spacers 26a and 26b form regions IIIa and IIIb (see FIG. 14) respectively. The substrate 21 forms a region IV (see FIG. 14). The regions 30a and 30b remaining below the side spaces 26a and 26b form LDD regions 27a and 27b respectively. The regions 22 and 23 change into a source region and a drain regions respectively. In some cases, the regions IIIa and IIIb extend into areas which are located immediately below the source region 22 and the drain region 23 and which have a vertical dimension similar to the vertical dimension of the region II.

Figure 21:
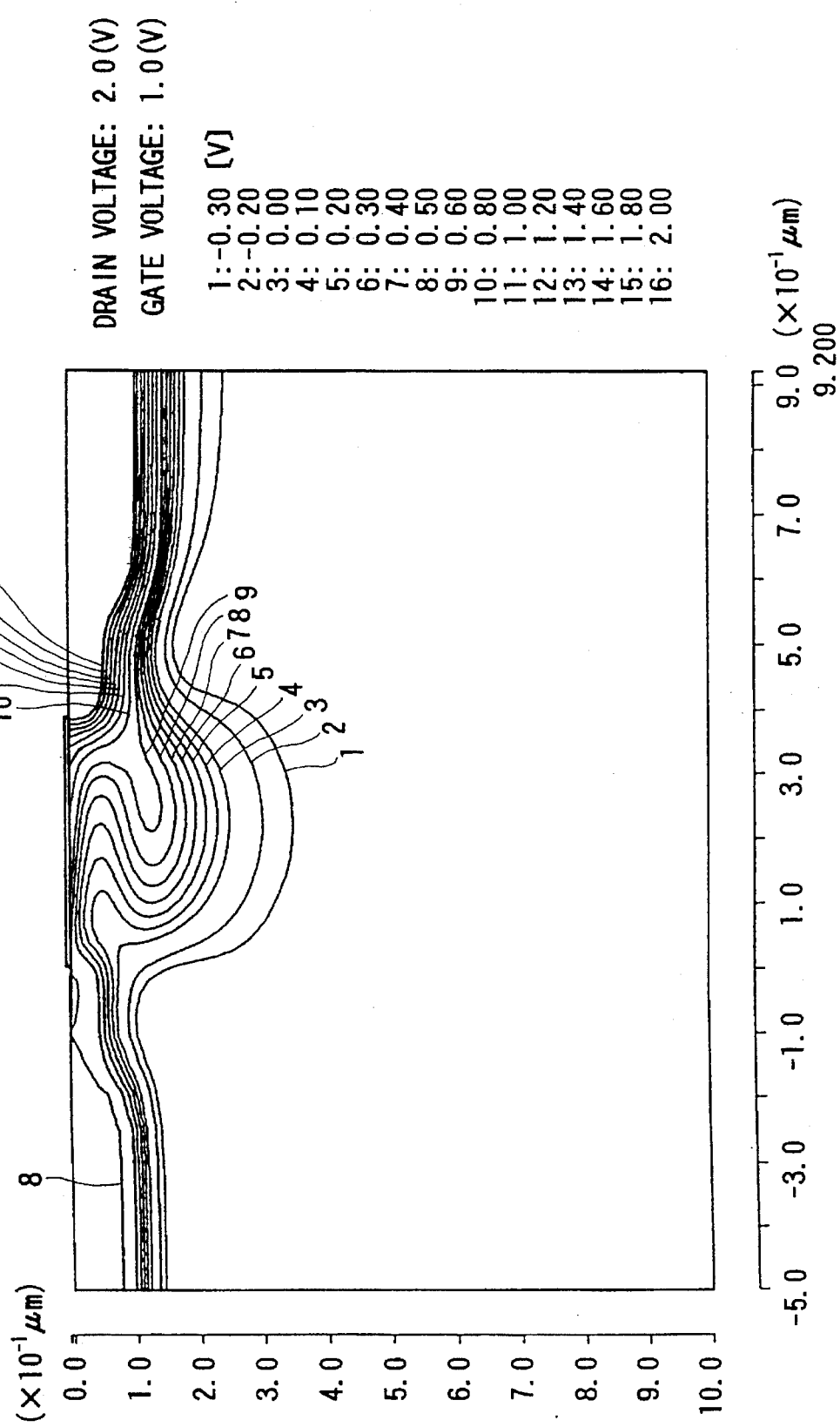
FIG. 21 is a diagram of a potential distribution in the semiconductor device of FIG. 14.

FIG. 21 shows a potential distribution in the MOSFET of FIG. 14 which is expressed with respect to a reference being a potential in an intrinsic silicon semiconductor. The potential distribution in FIG. 21 occurs under conditions where a drain voltage is set to 2 V while a gate voltage, a source voltage, and a substrate voltage are set to 0 V. In FIG. 21, the numerals such as "1", "2", and "16" denote potential contour lines (iso-potential lines).

As shown in FIG. 21, the region II is affected by the drain voltage so that potentials in a side portion of the region II close to the drain region 23 are higher than potentials in a side portion of the region II close to the source region 22. Since potentials in the region IIIa close to the source region 22 are stable, potentials in a channel portion are stabilized via the region IIIa. Accordingly, good characteristics of the MOSFET are available.

Figure 22:
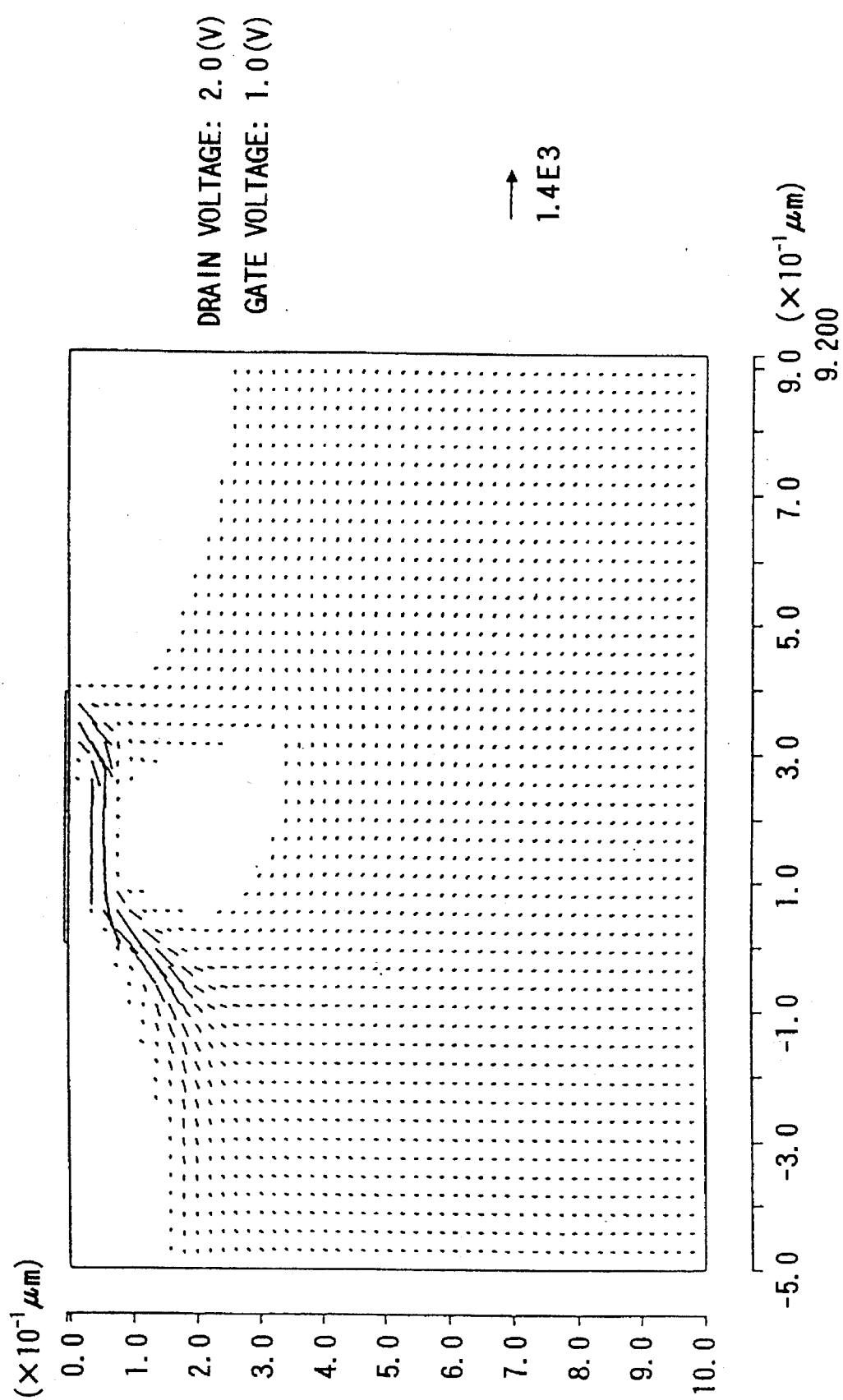
FIG. 22 is a diagram of flows of holes in the semiconductor device of FIG. 14.

FIG. 22 shows an example of flows of holes (substrate currents) which are caused by hot electrons in an area near the drain region 23. The region IIIa close to the source region 22 is not depleted, and the region IIIa electrically connects with the region I. Accordingly, holes produced in the drain region 23 advance along the boundary between the regions I and II, and flow into the substrate 21 via the region IIIa close to the source region 22. This path of flow of holes prevents the kink effect, that is, the excessive increase in the drain current by an increased channel potential due to accumulation of holes in the channel portion in the region I.

In this embodiment, even if the region IIIb close to the drain region 23 is depleted so that the region II electrically connects with the drain region 23, stable characteristics of the MOSFET are maintained as long as the region IIIa close to the source region 22 is not depleted. Accordingly, the width of the regions IIIa and IIIb can be chosen regardless of the width of a depletion layer caused by the drain region 23. It should be noted that, as previously described, the width of the regions IIIa and IIIb is set greater than the sum of the width of a depletion layer caused by the source region 22 and the with of a depletion layer caused by the junction with the region II.

Sixth Embodiment

Figure 23:
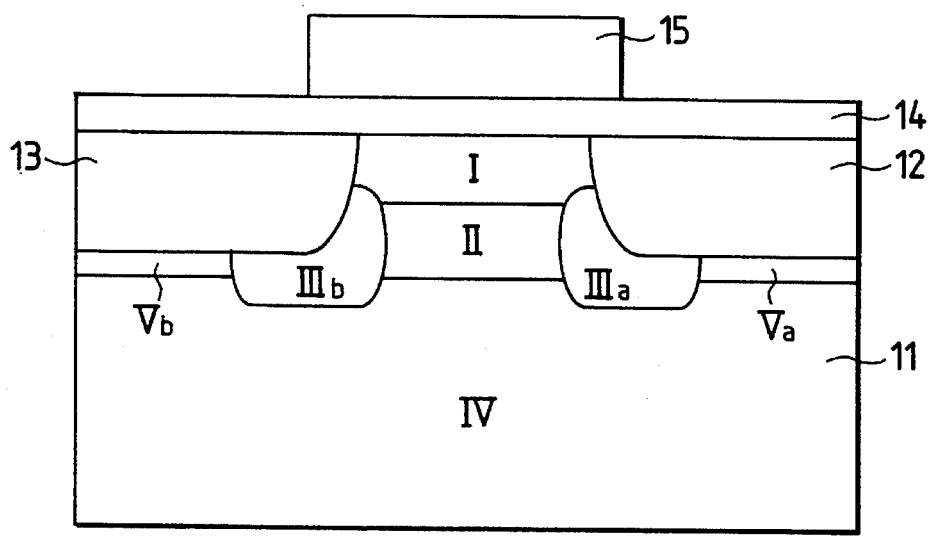
Figure 24:
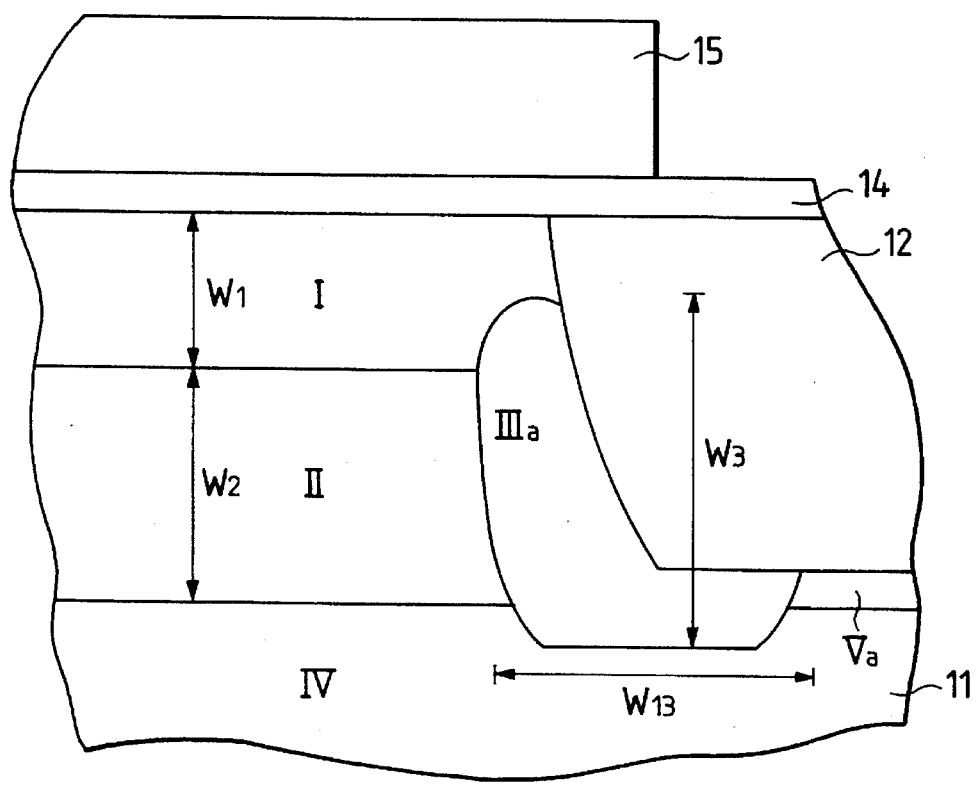
FIG. 24 is an enlarged view of a portion of FIG. 23.

With reference to FIGS. 23 and 24, a MOSFET (semiconductor device) includes a substrate 11 formed with a source region 12 and a drain region 13. The source region 12 and the drain region 13 are separated from each other by a plurality of regions I, II, IIIa, and IIIb extending on the substrate 11. The substrate 11 forms a region IV. Regions Va and Vb prodded on the substrate 11 adjoin the regions IIIa and IIIb, and extend immediately below the source region 12 and the drain region 13 respectively.

The region I is sandwiched between the source region 12 and the drain region 13. The region II extends immediately below a central area of the region I. The region II aligns with the region I along a depth direction (vertical direction). The region II is separated from the source region 12 and the drain region 13 by the regions IIIa and IIIb respectively. In other words, the region IIIa extends between the source region 12 and the region II while the region IIIb extends between the drain region 13 and the region II. The regions IIIa and IIIb extend immediately below edge portions of the region I. In addition, the regions IIIa and IIIb extend immediately below edge portions of the source region 12 and the drain region 13 respectively. The region Va extending immediately below the source region 12 is separated from the region II by the region IIIa. The region Vb extending immediately below the drain region 13 is separated from the region II by the region IIIb. The region IV extends immediately below the region II, the regions IIIa and IIIb, and the regions Va and Vb. Thus, the region Va is located between the source region 12 and the region IV while the region Vb is located between the drain region 13 and the region IV.

The source region 12, the region I, and the drain region 13 are coated with a gate insulating film 14 made of an oxide. In other words, the gate insulating film 14 extends immediately above the source region 12, the region I, and the drain region 13. A gate electrode 15 extends on the gate insulating film 14, and aligns with the region I along a vertical direction (depth direction). A central area of the gate electrode 15 is located directly above the region I. Edge areas of the gate electrode 15 are located directly above the source region 12 and the drain region 13 respectively.

The region IV, that is, the substrate 11, is of a first conduction type. The source region 12 and the drain region 13 are of a second conduction type opposite to the first conduction type. The region I is of the first conduction type. The region II is of the second conduction type. The region IIIa and IIIb are of the first conduction type. The regions Va and Vb are of the second conduction type. In cases where the substrate 11 or the region IV is of the p-type, the regions I, IIIa, and IIIb are of the p-type while the regions II, Va, and Vb, the source region 12, and the drain region 13 are of the n-type. In cases where the substrate 11 or the region IV is of the n-type, the regions I, IIIa, and IIIb are of the n-type while the regions II, Va, and Vb, the source region 12, and the drain region 13 are of the p-type.

A central portion of the region I has a width W1 along a depth direction. The presence of a gate bias provides a depletion layer, the width of which along the depth direction is denoted by Wg. The junction between the regions I and II provides a depletion layer, the width of which along the depth direction is denoted by Wj1. The depth-direction width W1 of the region I is set smaller than the sum of the depletion layer widths Wg and Wj1. Thus, there is a relation as "W1<Wg+Wj1".

The region II has a width W2 along the depth direction. The depth-direction width W2 of the region II may be set to an arbitrary value. The lower surface of the region II is in a position deeper than the position of the lower surfaces of the source region 12 and the drain region 13.

The regions IIIa and IIIb have a width W3 along the depth direction. The depth-direction width W3 of the regions IIIa and IIIb is set greater than the depth-direction width W2 of the region II. Thus, there is a relation as "W3>W2".

The regions IIIa and IIIb have a width W13 along a lateral direction (horizontal direction). Regarding the region II, the drain region 13 provides a depletion layer, the width of which along the lateral direction is denoted by Wd. The junctions among the regions II, IIIa, and IIIb provide depletion layers, the width of which along the lateral direction is denoted by Wj3. The lateral-direction width W13 of the regions IIIa and IIIb is set greater than the sum of the depletion layer widths Wd and Wj3. Thus, there is a relation as "W13>Wd+Wj3".

It is preferable that the impurity concentration (impurity density) N4 in the region IV is set smaller than the impurity concentrations N1, N2, N3, and N5 in the respective regions I, II, IIIa (and IIIb), and Va (and Vb). Thus, there is a relation as "N4<N1, N2, N3, N5".

During operation of the MOSFET, the region I undergoes an inversion and forms a channel region for conducting carriers. The threshold voltage of the MOSFET can be adjusted according to the impurity concentration in the region I.

The region II connects with the region I via a pn junction, which depletes the region I. Accordingly, when a given potential is applied to the gate electrode 15, the region II helps the region I to be depleted. Thus, the region II reduces a virtual capacitance as seen from the gate electrode 15. In addition, the region II decreases the threshold voltage of the MOSFET.

The region IIIb blocks the spread of a depletion layer from the drain region 13, thereby preventing the establishment of conduction (continuity) between the drain region 13 and the region II. The region IIIa blocks the spread of a depletion layer from the source region 12, thereby preventing the establishment of conduction (continuity) between the source region 12 and the region II. As a result, the regions IIIa and IIIb prevent the punch through phenomenon, that is, the establishment of conduction (continuity) between the source region 12 and the drain region 13. In addition, the regions IIIa and IIIb electrically connect the region I and the region IV with each other, and hence stabilizes a potential in the region I.

The impurity concentration in the region IV determines the capacitances of the source region 12 and the drain region 13. Since the prevention of the punch through phenomenon is implemented by the regions IIIa and IIIb, the impurity concentration in the region IV can be chosen without considering the prevention of the punch through phenomenon. It is preferable that the impurity concentration in the region IV is set to a small value to provide smaller capacitances of the source region 12 and the drain region 13.

The impurity concentration in the regions Va and Vb is smaller than the impurity concentration in the source region 12 and the drain region 13. Electric fields can be reduced and diffusion capacitances can be decreased by suitably adjusting the depth or thickness of the regions Va and Vb.

Figure 25:
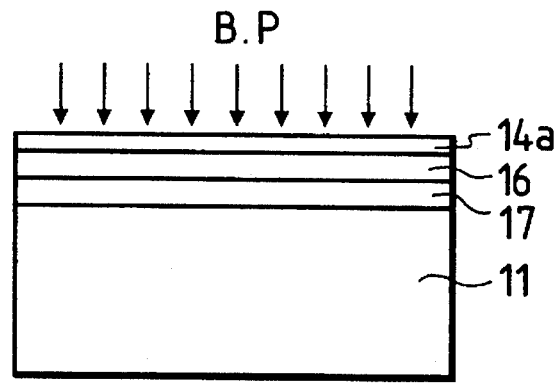
FIG. 25 is a sectional diagram of a semiconductor device according to a sixth embodiment of this invention.

The MOSFET of FIGS. 23 and 24 is fabricated as follows. With reference to FIG. 25, a p-type substrate 11 is prepared which will form a region IV. The substrate 11 has an impurity concentration (impurity density) of $1.5\times10^{16}$ cm$^{-3}$. A sacrifice oxide film 14a is formed on a surface of the substrate 11. Boron (B) ions are implanted into the substrate 11 via the sacrifice oxide film 14a while being accelerated at 25 KeV. The boron ion dose is equal to $1.5\times10^{12}$ cm$^{-2}$. In addition, phosphorus (P) ions are implanted into the substrate 11 via the sacrifice oxide film 14a while being accelerated at 160 KeV. The phosphorus ion dose is equal to $2.5\times10^{12}$ cm$^{-2}$. As a result, a B-doped layer 16 is formed immediately below the sacrifice oxide film 14a, and a P-doped layer 17 is formed immediately below the B-doped layer 16. A heating process on the implanted B and P ions will be executed later. The B-doped layer 16 will form a region I while the P-doped layer 17 will form regions II, Va, and Vb.

Figure 26:
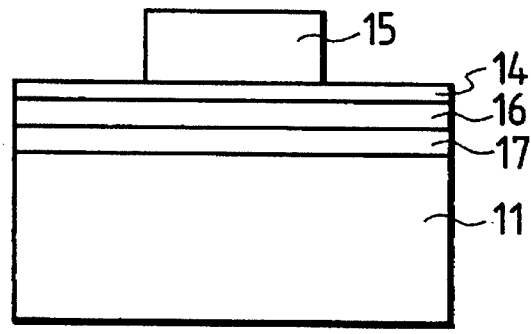

After the ion implantations, the sacrifice oxide film 14a is replaced by a gate insulating film 14 made of an oxide as shown in FIG. 26. A thin film of polycrystalline silicon is formed on the gate insulting film 14. As shown in FIG. 26, the polycrystalline silicon film is etched into a gate electrode 15.

Figure 27:
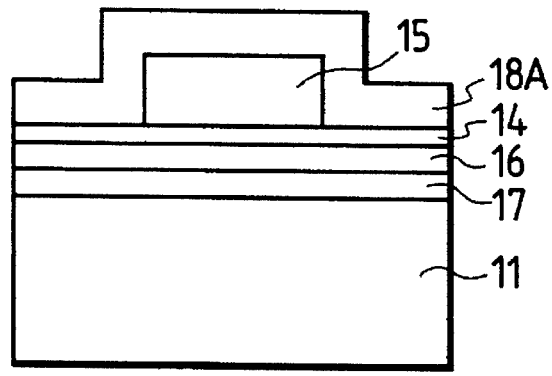
Figure 28:
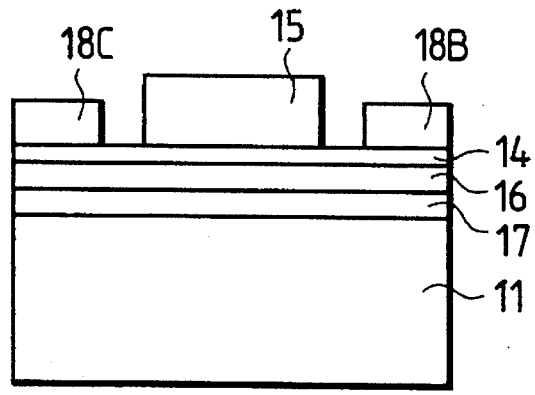

Subsequently, as shown in FIG. 27, exposed surfaces of the gate insulating film 14 and the gate electrode 15 are coated with a layer 18A of photoresist. Portions of the photoresist layer 18A are removed by selective etching so that the gate electrode 15 and areas of the gate insulating film 14 near the gate electrode 15 are exposed as shown in FIG. 28. Remaining portions of the photoresist layer 18A form islands 18B and 18C on the gate insulating film 14.

Figure 29:
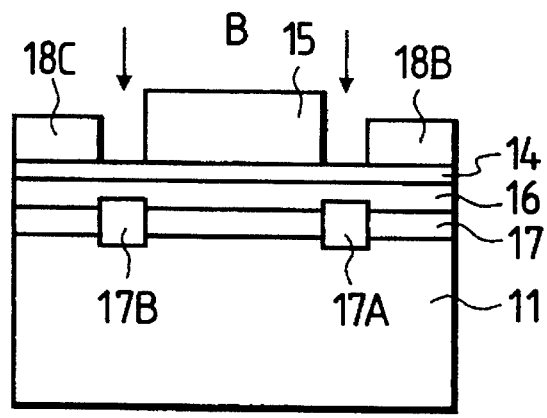

Then, as shown in FIG. 29, while the gate electrode 15 and the photoresist layers 18B and 18C are used as a mask, boron (B) ions are implanted via the gate insulating film 14 into regions 17A and 17B which contain the P-doped layer 17 and which extend into areas immediately above and below the P-doped layer 17 lying outward of the gate electrode 15. The boron ion dose related to the regions 17A and 17B is greater than the phosphorus ion dose related to the P-doped layer 17. The implanted B ions will be subjected to a heating process executed later. The regions 17A and 17B will form regions IIIa and IIIb respectively.

Figure 30:
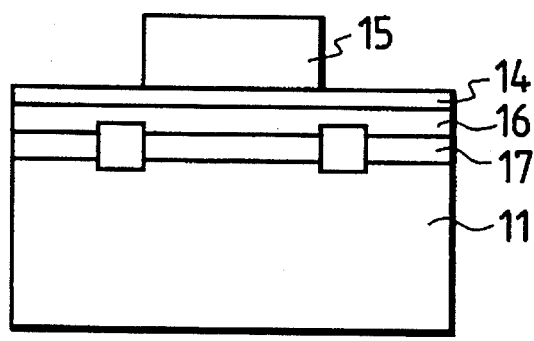
Figure 31:
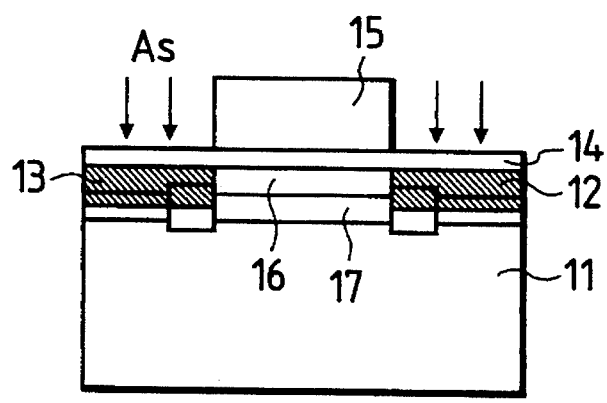

After the B ion implantation, the photoresist layers 18B and 18C are removed as shown in FIG. 30. Subsequently, as shown in FIG. 31, while the gate electrode 15 is used as a mask, arsenic (As) ions are implanted via the gate insulating film 14 into regions 12 and 13 which extend outward of the gate electrode 15 and which contain the B-doped layer 16, upper portions of the regions 17A and 17B, and upper portions of the P-doped layer 17. The arsenic ion dose is greater than the boron ion dose.

Figure 32:
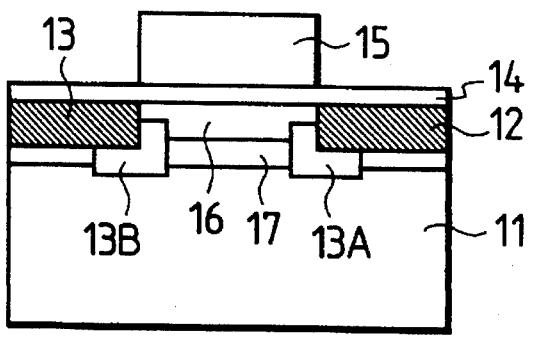

Then, the substrate 11 with the previously-indicated regions is subjected to a heating process. During the heating process, boron ions having a greater diffusion coefficient than that of arsenic ions are diffused from the regions 17A and 17B into areas which extend below edge portions of the gate electrode 15. Thus, as shown in FIG. 32, the regions 17A and 17B are expanded into regions 13A and 13B forming regions IIIa and IIIb (see FIG. 23) respectively. The heating process acts on the implanted arsenic ions so that the regions 12 and 13 are activated into a source region and a drain region respectively. The regions 16 and 17 extending below the gate electrode 15 form regions I and II (see FIG. 23) respectively. In addition, lower portions of the P-doped layer 17 which extend below the source region 12 and the drain region 13 form regions Va and Vb (see FIG. 23) respectively. The substrate 11 extending below the regions II, IIIa, IIIb, Va, and Vb forms a region IV (see FIG. 23).

It should be noted that the regions IIIa and IIIb may be formed in other ways described regarding the previous embodiments.

Seventh Embodiment

Figure 33:
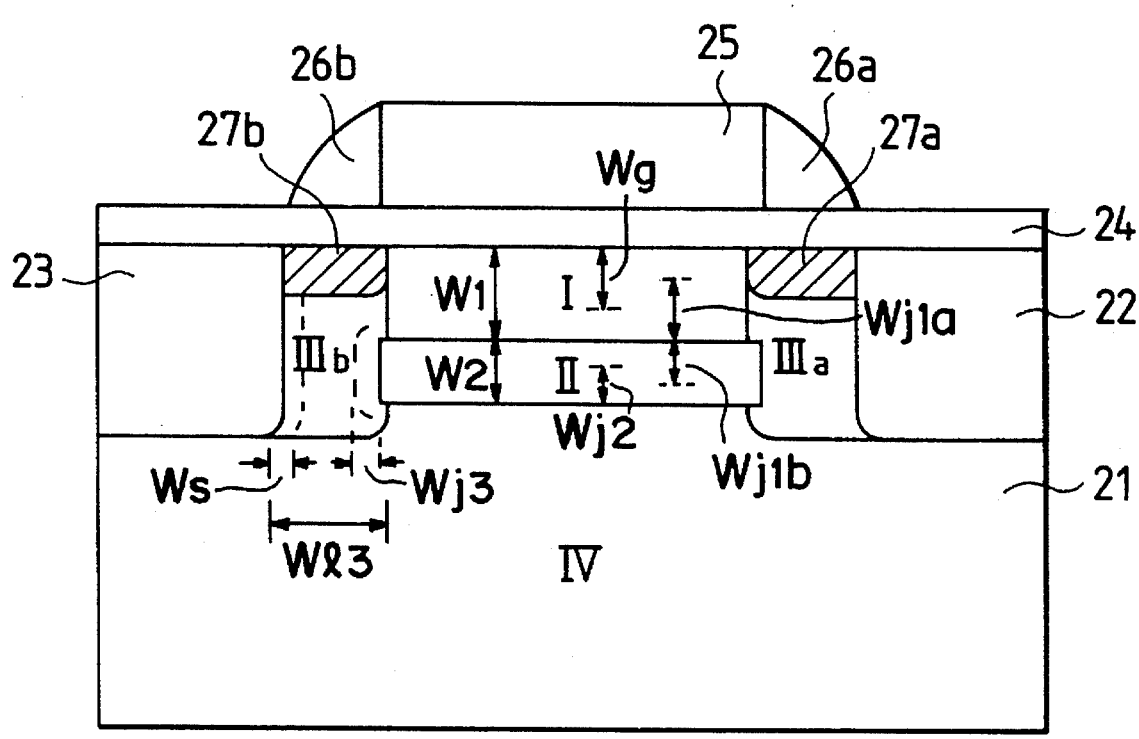
FIG. 33 is a sectional diagram of a semiconductor device according to a seventh embodiment of this invention.

With reference to FIG. 33, a MOSFET (semiconductor device) includes a substrate 21 formed with a source region 22 and a drain region 23. The source region 22 and the drain region 23 are separated from each other by a plurality of regions I, II, IIIa, IIIb, 27a, and 27b extending on the substrate 21. The substrate 21 forms a region IV. The regions 27a and 27b are designed to provide an LDD structure.

The region I is sandwiched between the LDD regions 27a and 27b, and also between the regions IIIa and IIIb. The region II extends immediately below the region I, and aligns with the region I along a vertical direction (depth direction). The region II is separated from the source region 22 and the drain region 23 by the regions IIIa and IIIb respectively. In other words, the region IIIa extends between the source region 22 and the region II while the region IIIb extends between the drain region 23 and the region II. The LDD region 27a extends between the region I and the source region 22. The LDD region 27b extends between the region I and the drain region 23. The region IIIa extends immediately below the LDD region 27a. The region IIIb extends immediately below the LDD region 27b. The region IV extends immediately below the region II, the regions IIIa and IIIb, the source region 22, and the drain region 23.

The source region 22, the region I, the drain region 23, and the LDD regions 27a and 27b are coated with a gate insulating film 24 made of an oxide. In other words, the gate insulating film 24 extends immediately above the source region 22, the region I, the drain region 23, and the LDD regions 27a and 27b. A gate electrode 25 extends on the gate insulating film 24, and aligns with the regions I and II along a vertical direction (depth direction). Nonconductive side spacers 26a and 26b provided on the gate insulating film 24 extend along opposite sides of the gate electrode 25 respectively. The LDD regions 27a and 27b are located below the side spacers 26a and 26b respectively.

The region IV, that is, the substrate 21, is of a first conduction type. The source region 22 and the drain region 23 are of a second conduction type opposite to the first conduction type. The region I is of the first conduction type. The region II is of the second conduction type. The region IIIa and IIIb are of the first conduction type. The LDD regions 27a and 27b are of the second conduction type. In cases where the substrate 21 or the region IV is of the p-type, the regions I, IIIa, and IIIb are of the p-type while the region II, the source region 22, the drain region 23, and the LDD regions 27a and 27b are of the n-type. In cases where the substrate 21 or the region IV is of the n-type, the regions I, IIIa, and IIIb are of the n-type while the region II, the source region 22, the drain region 23, and the LDD regions 27a and 27b are of the p-type.

A central portion of the region I has a width W1 along a depth direction. The presence of a gate bias provides a depletion layer, the width of which along the depth direction is denoted by Wg. The pn junction between the regions I and II provides a depletion layer in the region I, and the width of this depletion layer along the depth direction is denoted by Wj1$a$. The depth-direction width W1 of the region I is set smaller than the sum of the depletion layer widths Wg and Wj1$a$. Thus, there is a relation as "W1<Wg+Wj1$a$".

The region II has a Width W2 along the depth direction. The pn junction between the regions I and II provides a depletion layer in the region II, and the width of this depletion layer along the depth direction is denoted by Wj1$b$. The pn junction between the regions II and IV provides a depletion layer, the width of which along the depth direction is denoted by Wj2. The depth-direction width W2 of the region II is set smaller than the sum of the depletion layer widths Wj1$b$ and Wj2. Thus, there is a relation as "W2<Wj1$b$+Wj2".

The regions IIIa and IIIb have a width W3 along the depth direction. It is preferable that the depth-direction width W3 of the regions IIIa and IIIb is set greater than the depth-direction width W2 of the region II. Thus, in this case, there is a relation as "W3>W2".

The regions IIIa and IIIb have a width W13 along a lateral direction (horizontal direction). Regarding the region II, the source region 22 provides a depletion layer, the width of which along the lateral direction is denoted by Ws. The junctions among the regions II, IIIa, and IIIb provide depletion layers, the width of which along the lateral direction is denoted by Wj3. The lateral-direction width W13 of the regions IIIa and IIIb is set greater than the sum of the depletion layer widths Ws and Wj3. Thus, there is a relation as "W13>Ws+Wj3".

It is preferable that the impurity concentration (impurity density) N4 in the region IV is set smaller than the impurity concentrations N1, N2, and N3 in the respective regions I, II, and IIIa (and IIIb). Thus, there is a relation as "N4<N1, N2, N3".

During operation of the MOSFET, the region I undergoes an inversion and forms a channel region for conducting carriers. The threshold voltage of the MOSFET can be adjusted according to the impurity concentration in the region I.

The region II connects with the region I via a pn junction, which depletes the region I. The region II connects with the region IV (substrate 21) via a pn junction, which depletes a surface portion of the region IV. The pn junction among the regions I, II, and IV also depletes the region II. Accordingly, when a given potential is applied to the gate electrode 25, the region II helps the depletion. Thus, the region II reduces a virtual capacitance as seen from the gate electrode 25. In addition, the region II decreases the threshold voltage of the MOSFET.

The region IIIb blocks the spread of a depletion layer from the drain region 23, thereby preventing the establishment of conduction (continuity) between the drain region 23 and the region II. The region IIIa blocks the spread of a depletion layer from the source region 22, thereby preventing the establishment of conduction (continuity) between the source region 22 and the region II. As a result, the regions IIIa and IIIb prevent the punch through phenomenon, that is, the establishment of conduction (continuity) between the source region 22 and the drain region 23. In addition, the regions IIIa and IIIb electrically connect the region I and the region IV with each other, and hence stabilizes a potential in the region I.

The impurity concentration in the region IV determines the capacitances of the source region 22 and the drain region 23. Since the prevention of the punch through phenomenon is implemented by the regions IIIa and IIIb, the impurity concentration in the region IV can be chosen without considering the prevention of the punch through phenomenon. It is preferable that the impurity concentration in the region IV is set to a small value to provide smaller capacitances of the source region 22 and the drain region 23.

The MOSFET of FIG. 33 is fabricated in a method similar to the previously-described method of making the MOSFET of FIG. 14. During the fabrication of the MOSFET of FIG. 33, to form a B-doped layer 28, boron (B) ions are implanted into a substrate 21 via a sacrifice oxide film 24$a$ while being accelerated at 25 KeV (see FIG. 15). The boron ion dose is equal to $4 \times 10^{12}$ cm$^{-2}$. Furthermore, to form a P-doped layer 29, phosphorus (P) ions are implanted into the substrate 21 via the sacrifice oxide film 24$a$ while being accelerated at 120 KeV (see FIG. 15). The phosphorus ion dose is preferably in the range of $3.6 \times 10^{12}$ cm$^{-2}$ to $4.4 \times 10^{12}$ cm$^{-2}$. The phosphorus ion dose is most preferably equal to about $3.8 \times 10^{12}$ cm$^{-2}$. The B-doped layer 28 and the P-doped layer 29 will form a region I and a region II respectively.

Generally, the region I, the source region 22, and the drain region 13 vertically extend from the boundaries with the gate insulating film 24 to a place corresponding to a depth of about 0.1 μm. In addition, the region II vertically extends from the boundary with the region I to a place corresponding to a depth of about 0.2 μm. In some cases, the regions IIIa and IIIb extend into areas which are located immediately below the source region 22 and the drain region 23 and which have a vertical dimension similar to the vertical dimension of the region II.

Figure 34:
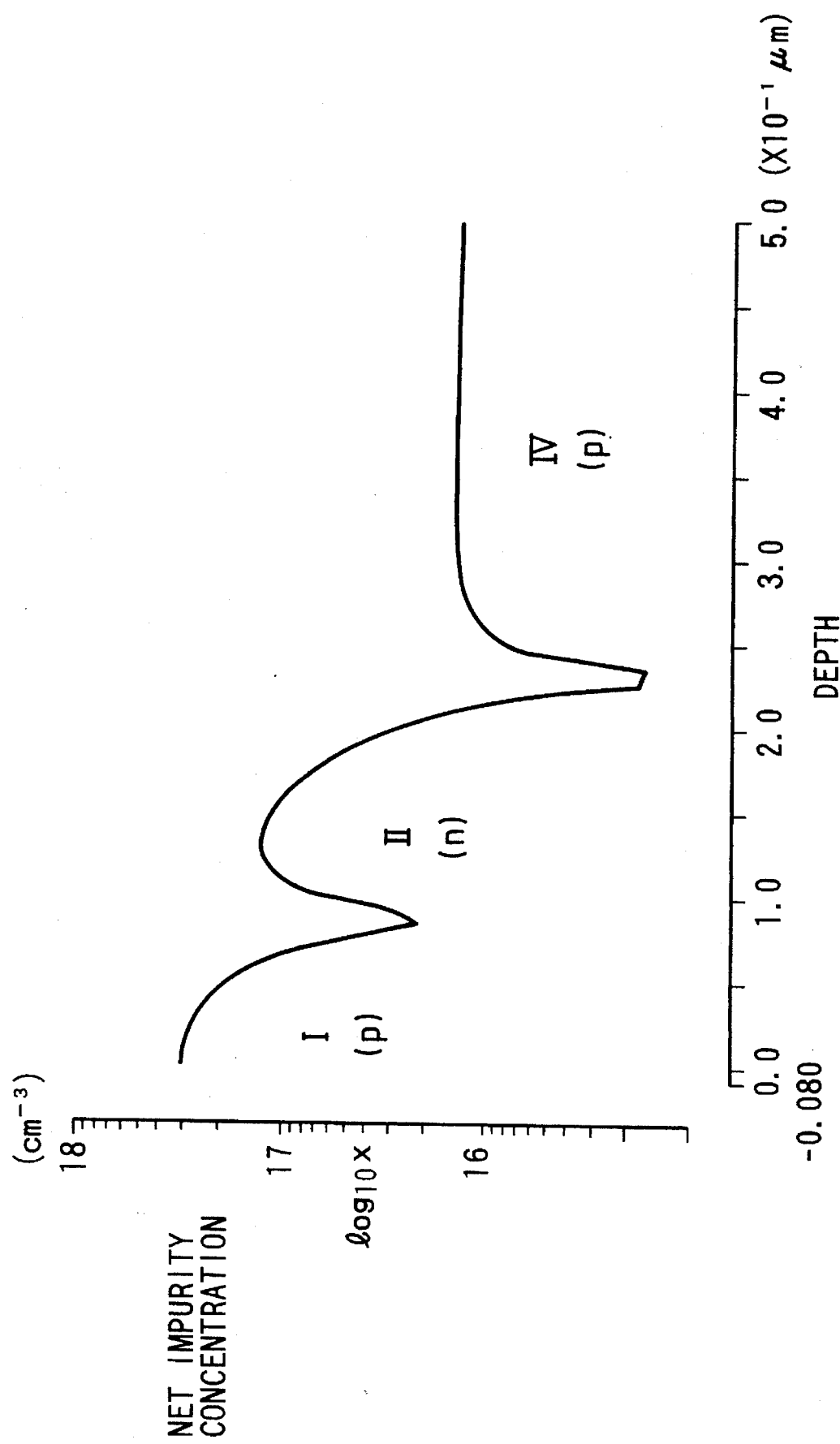
FIG. 34 is a diagram of an impurity concentration profile, along a depth direction, in a channel portion of the semiconductor device of FIG. 33.

FIG. 34 shows a net impurity concentration profile in the channel portion of the MOSFET along a depth direction (vertical direction). Here, the MOSFET is fabricated under conditions where the phosphorus ion dose related to the region II is set to $3.8 \times 10^{12}$ cm$^{-2}$. In FIG. 34, the impurity concentration decreases as the depth increases to about 0.1 μm. This part of the impurity concentration curve relates to the p-type impurities in the region I. In addition, the impurity concentration rises to a peak and then drops from the peak as the depth increases from about 0.1 μm to about 0.2 μm. This part of the impurity concentration curve relates to the n-type impurities in the region II. Furthermore, the part of the impurity concentration which extends in a deeper range relates to the p-type impurities in the region IV, that is, the substrate 21.

Figure 35:
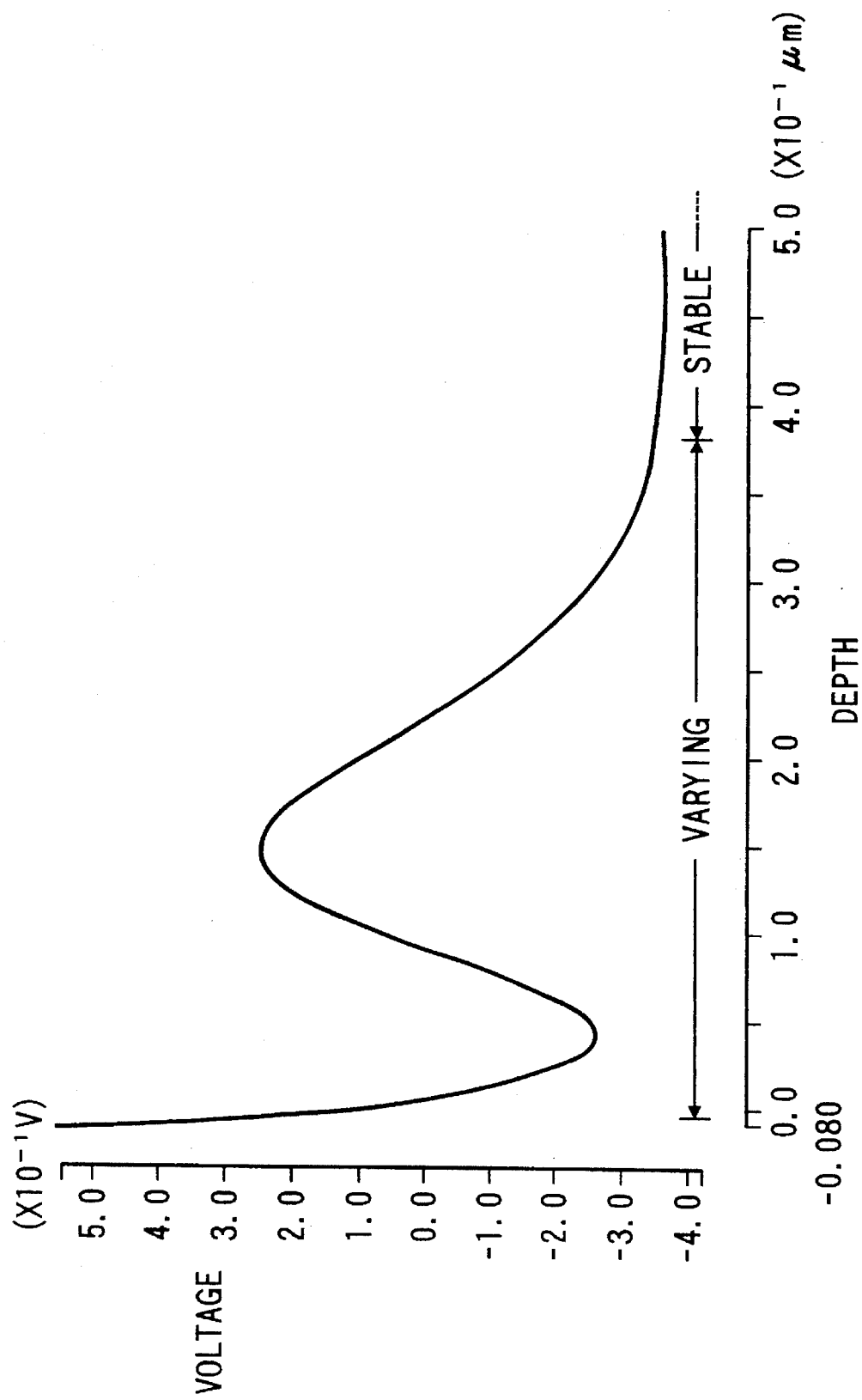
FIG. 35 is a diagram of a first example of a potential distribution profile along a depth direction in the semiconductor device of FIG. 33.

FIG. 35 shows a potential distribution profile in the channel portion of the MOSFET along a depth direction (vertical direction) which occurs when the gate electrode 25 is subjected to 0 V. Here, the MOSFET is fabricated under conditions where the phosphorus ion dose related to the region II is set to $3.8 \times 10^{12}$ cm$^{-2}$. In FIG. 35, the potential remarkably varies up and down as the depth increases to about 0.35 μm. This part of the potential curve shows the presence of a depletion layer. Accordingly, it is found that the depletion layer extends over the region II and reaches the region IV (substrate 21).

Figure 36:
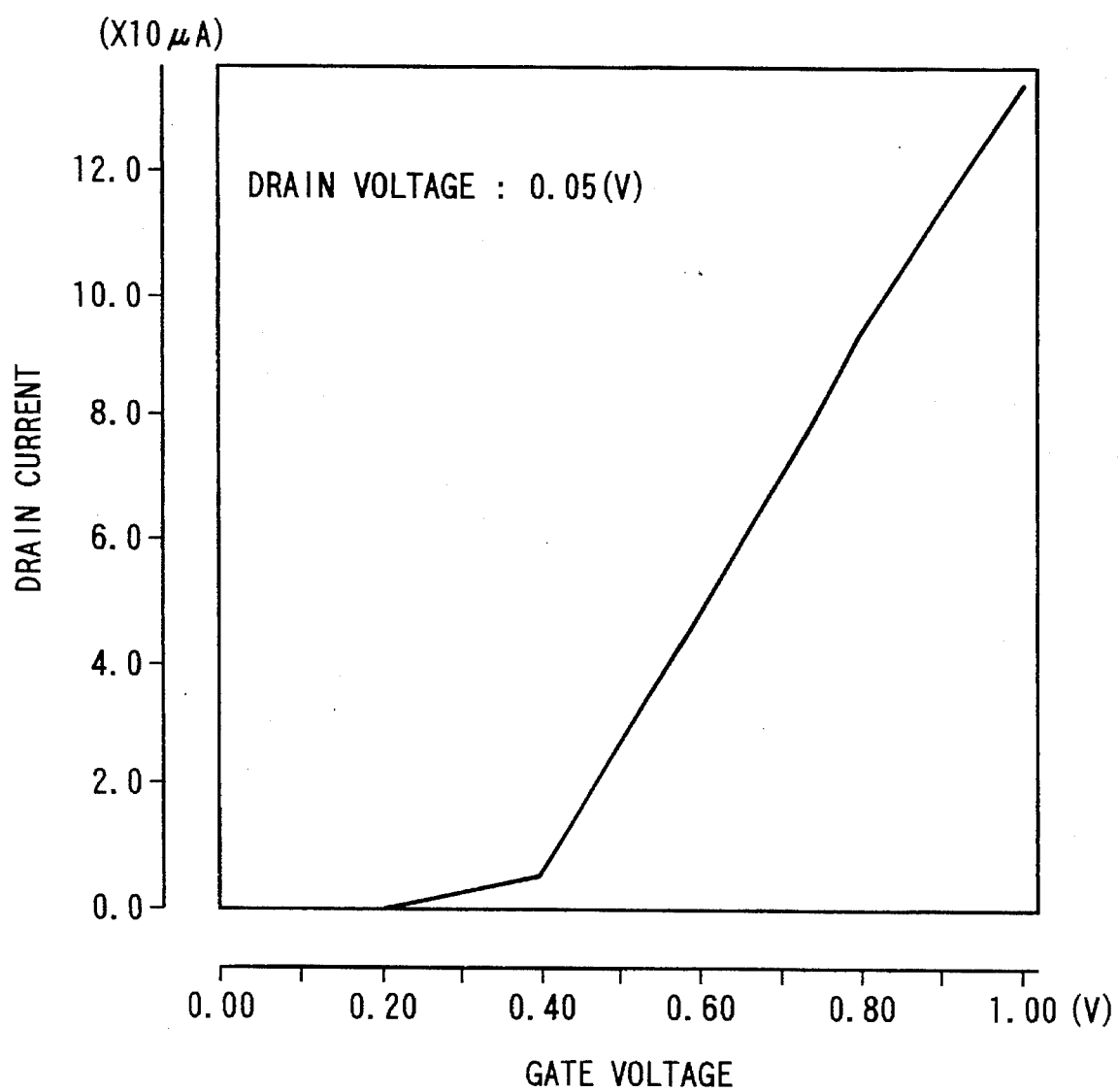
FIGS. 36 and 37 are different diagrams of the relation between a drain current and a gate voltage in the semiconductor device of FIG. 33 respectively.
Figure 37:
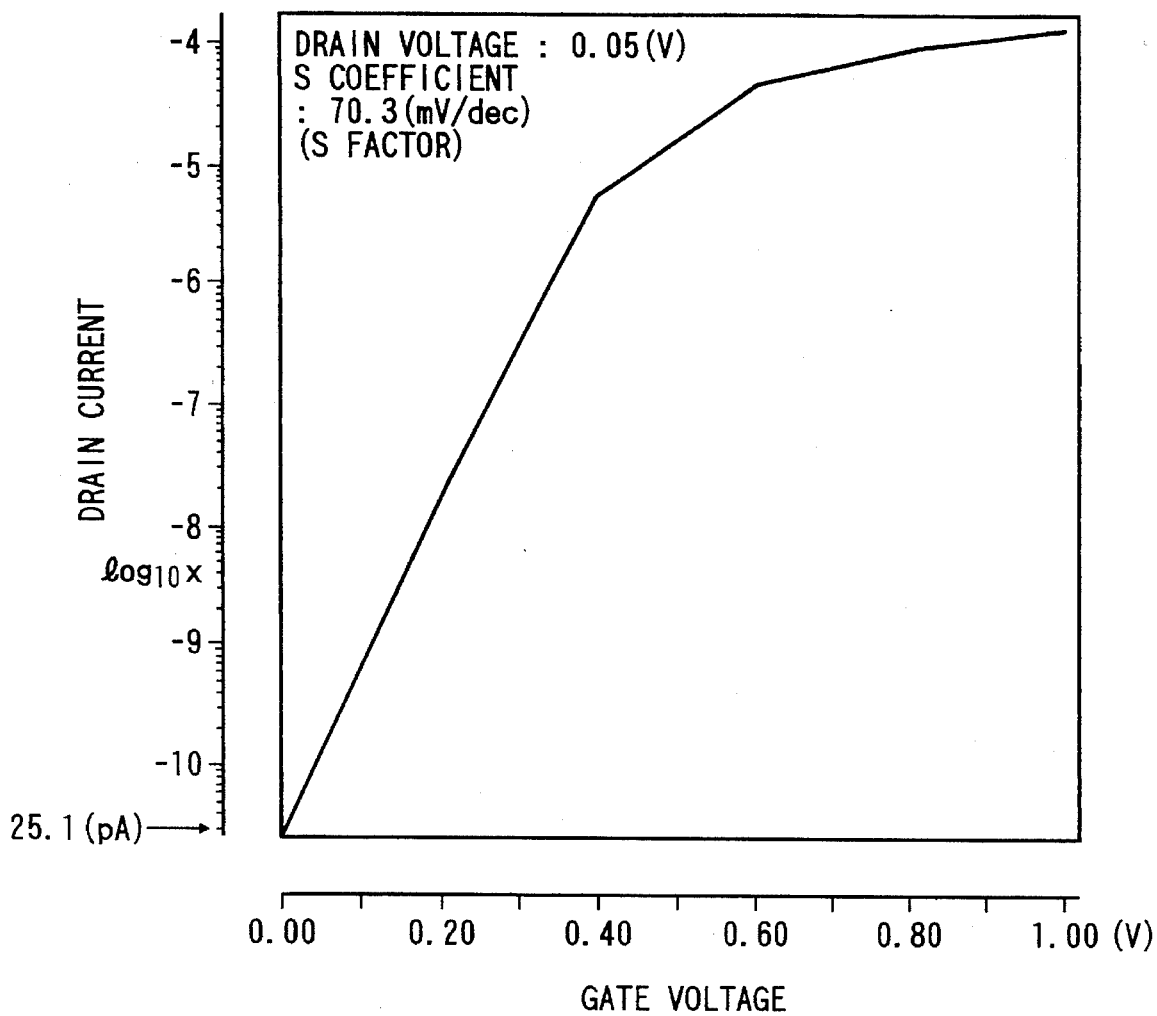

FIG. 36 shows the relation between a drain current and a gate voltage in the MOSFET which occurs when a drain voltage is equal to 0.05 V. FIG. 37 shows a relation similar to the relation in FIG. 36 except that a drain current is logarithmically expressed. It is understood from FIG. 36 that the threshold voltage of the MOSFET is equal to about 0.4

V. It is understood from FIG. 37 that the S coefficient (S factor) of the MOSFET is equal to about 70.3 mV/dec. In addition, the leak current of the MOSFET is equal to about 25.1 pA. It should be noted that the leak current is defined as corresponding to a drain current which occurs when the gate electrode 25 is subjected to 0 V. Thus, the leak current per 1-µm gate width is equal to less than 1 pA.

Figure 38:
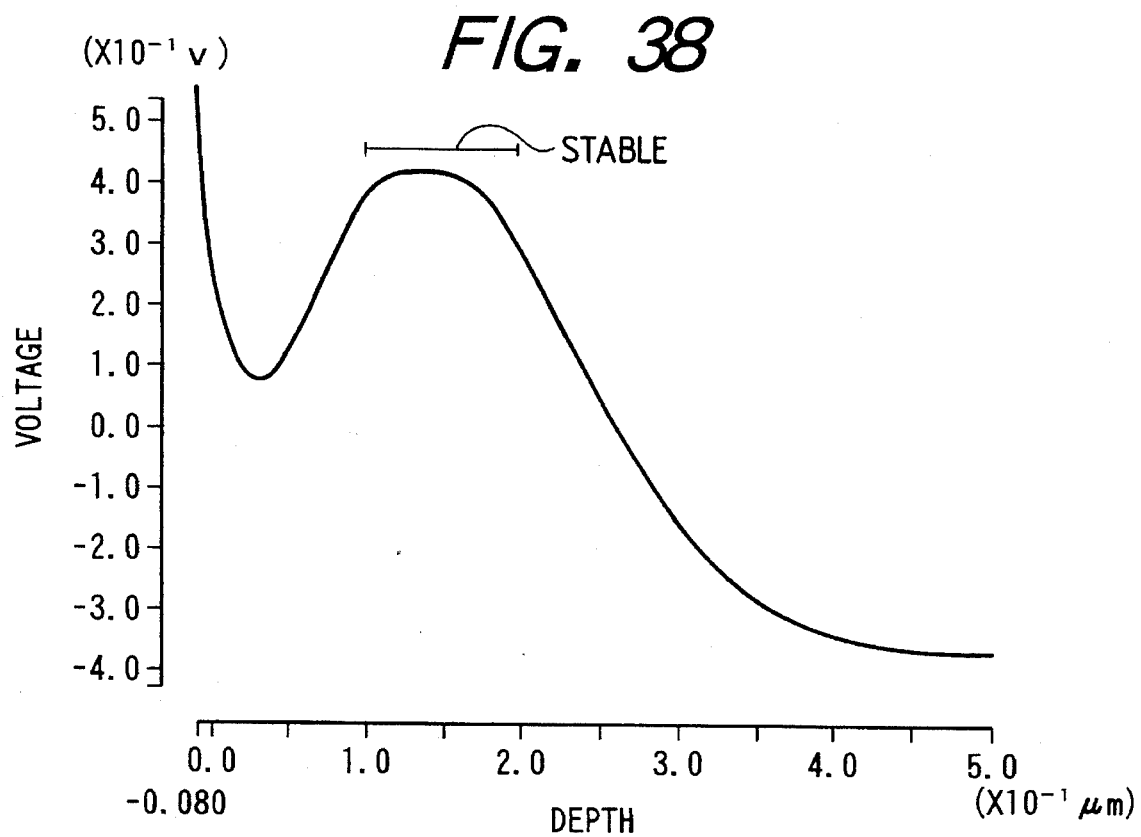
FIG. 38 is a diagram of a second example of a potential distribution profile along a depth direction in the semiconductor device of FIG. 33.

FIG. 38 shows a potential distribution profile in a MOSFET which corresponds to the potential distribution profile in FIG. 35 except that the MOSFET is fabricated under conditions where the phosphorus ion dose related to the region II is set to $5 \times 10^{12}$ cm$^{-2}$. In FIG. 38, the potential continues to be relatively stable as the depth increases from 0.1 µm to 0.2 µm. This part of the potential curve shows that a depletion layer does not reach the region IV (substrate 21). In the MOSFET related to FIG. 38, the S coefficient (S factor) is equal to about 110 mV/dec.

Figure 39:
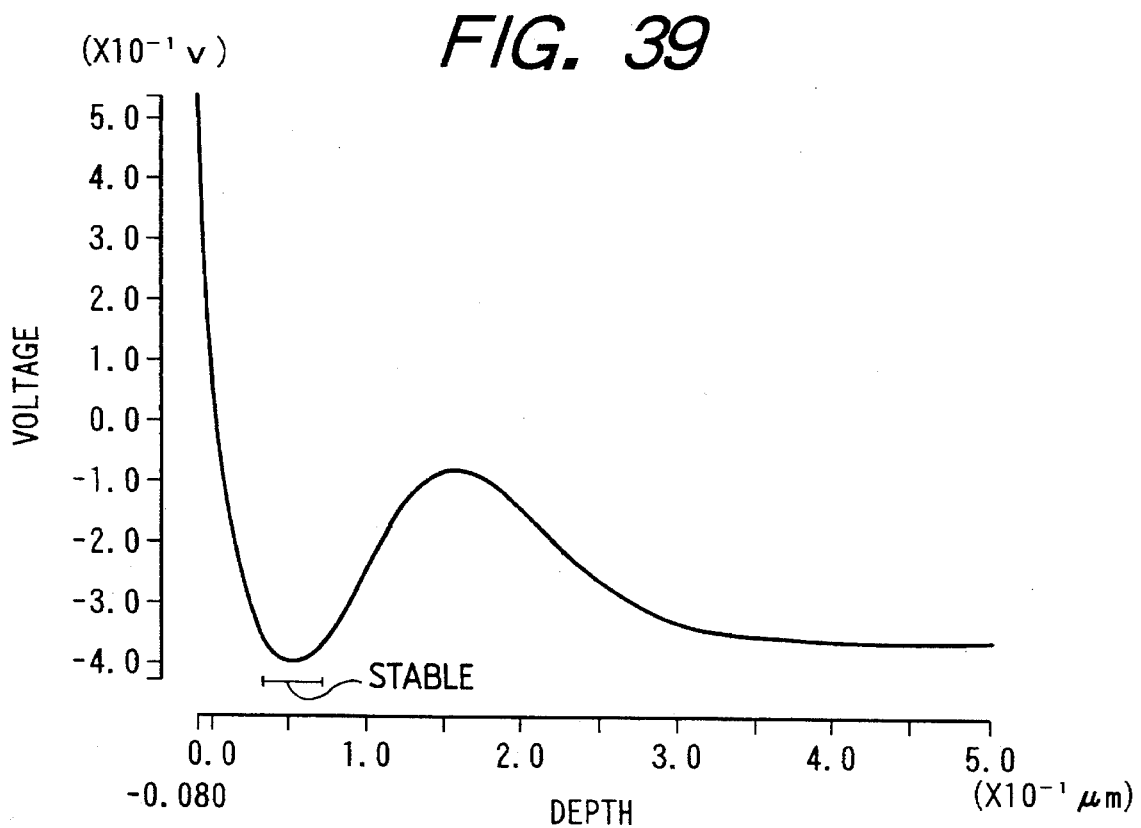
FIG. 39 is a diagram of a third example of a potential distribution profile along a depth direction in the semiconductor device of FIG. 33.

FIG. 39 shows a potential distribution profile in a MOSFET which corresponds to the potential distribution profile in FIG. 35 except that the MOSFET is fabricated under conditions where the phosphorus ion dose related to the region II is set to $3 \times 10^{12}$ cm$^{-2}$. In FIG. 39, the potential remains relatively stable at and around a depth of 0.05 µm although the potential remarkably varies as the depth increases from 0.1 µm to 0.3 µm. These parts of the potential curve show that the region II is depleted but the region I is not adequately depleted. In the MOSFET related to FIG. 39, the S coefficient (S factor) is equal to about 90 mV/dec.

Figure 40:
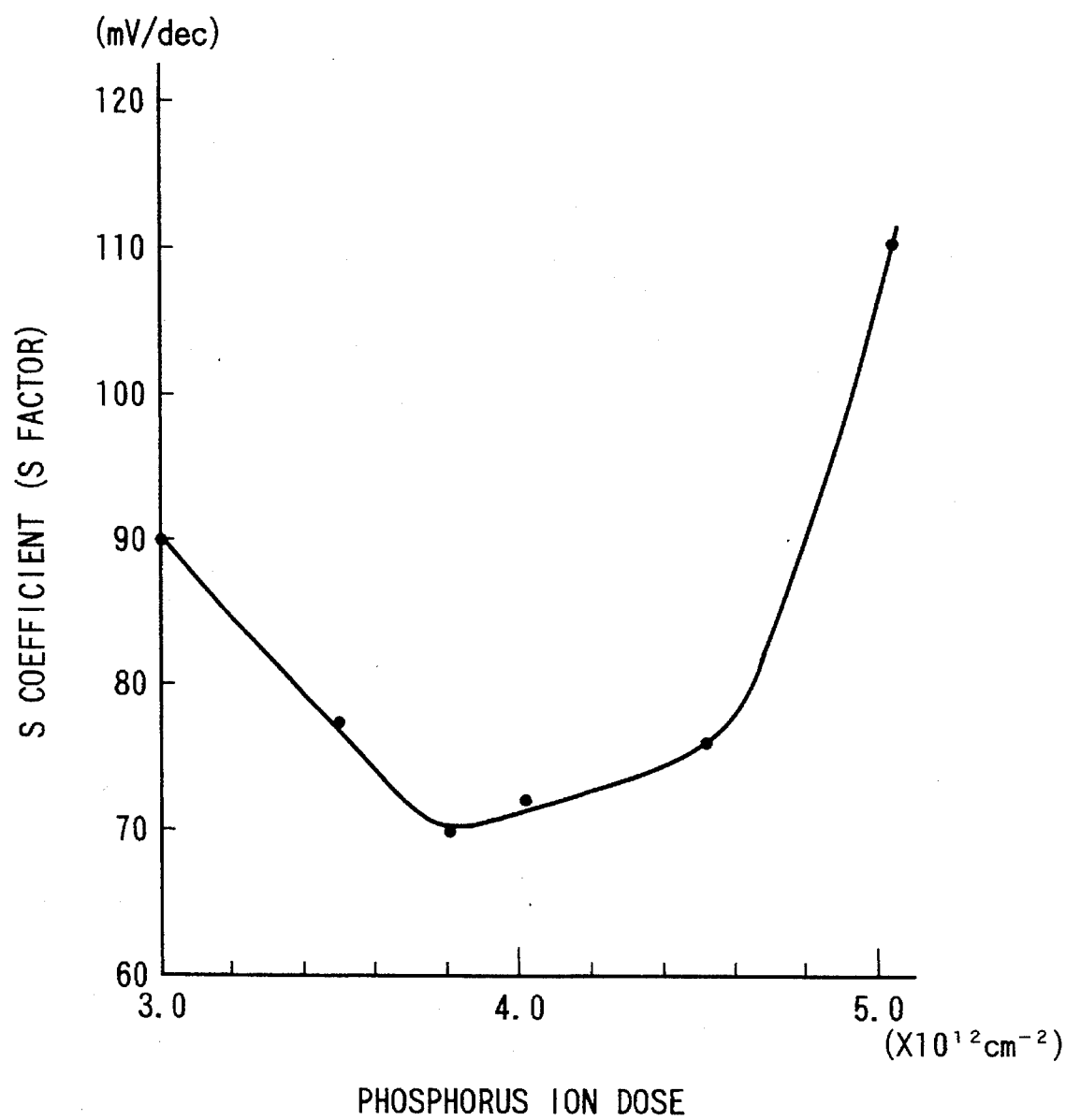
FIG. 40 is a diagram of the relation between a phosphorus ion dose and an S coefficient (also referred to as an S factor) in connection with the semiconductor device of FIG. 33.

MOSFET's have been made while the phosphorus ion dose related to the region II is varied. FIG. 40 shows the relation between the phosphorus ion dose and the S coefficient (S factor) which is provided regarding the MOSFET's. As shown in FIG. 40, the S coefficient (S factor) is acceptably low when the phosphorus ion dose is in the range of $3.6 \times 10^{12}$ cm$^{-2}$ to $4.4 \times 10^{12}$ cm$^{-2}$. This range of the phosphorus ion dose ensures a low threshold voltage and a small leak current in a related MOSFET. In addition, this range of the phosphorus ion dose enables the regions I and II in a related MOSFET to be completely depleted. The low S coefficient (S factor) enables a low capacitance in the related MOSFET. The sum of the depth of the region I and the depth of the region II is smaller than the depth (width) of the depletion layer.

Eighth Embodiment

Figure 41:
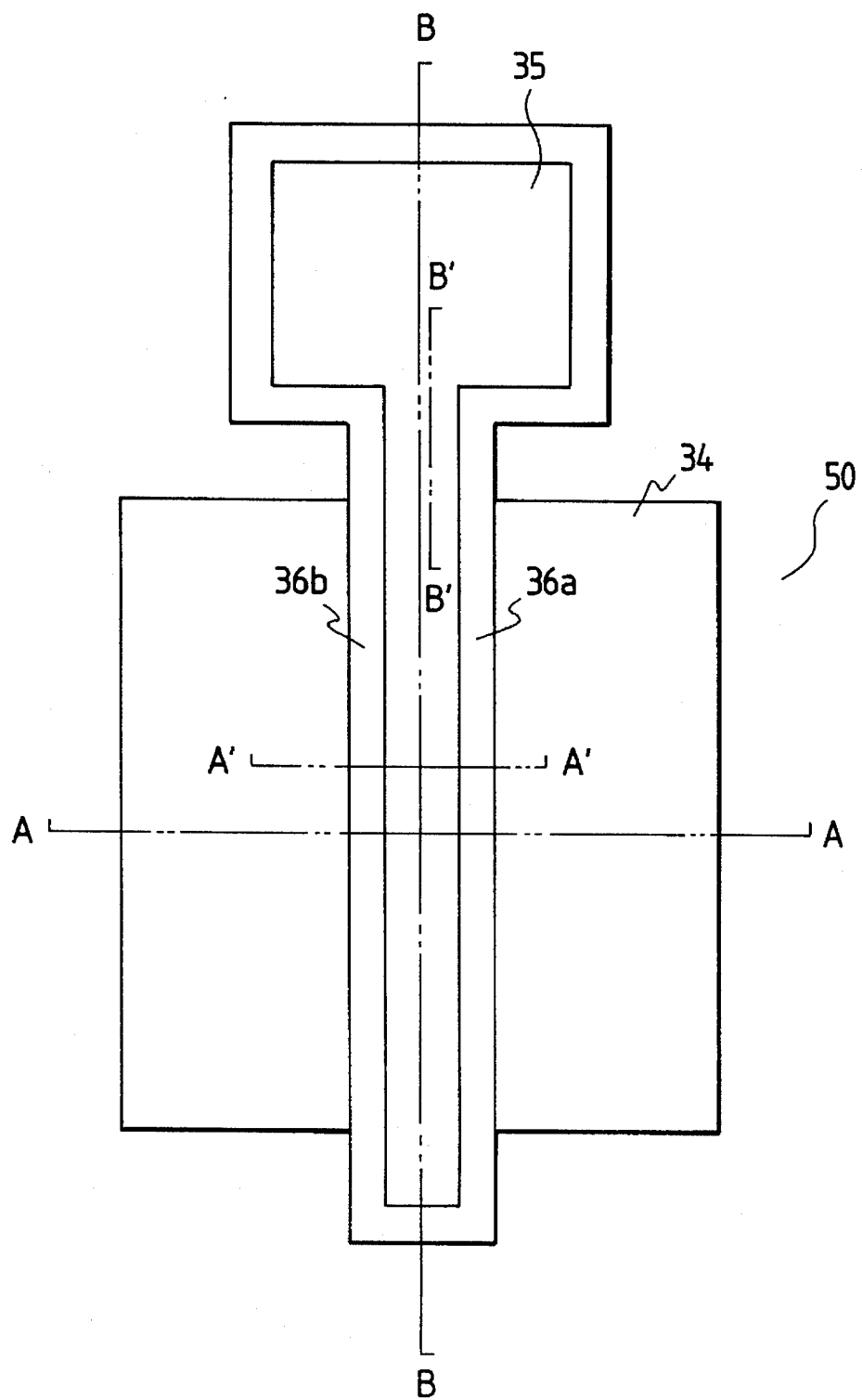
FIG. 41 is a top view of a semiconductor device according to an eighth embodiment of this invention.

With reference to FIG. 41, a MOSFET (semiconductor device) includes a gate insulating film 34 and a gate electrode 35 provided on a substrate (no reference character in FIG. 41). The gate electrode 35 extends across the gate insulating film 34. A portion of the gate electrode 35 which overlaps the gate insulating film 34 extends on the gate insulating film 34. The gate insulating film 34 is made of an oxide. The gate insulating film 34 and the gate electrode 35 are surrounded by a field oxide film 50 which separates and isolates the MOSFET from neighboring devices (MOSFET's)

Figure 42:
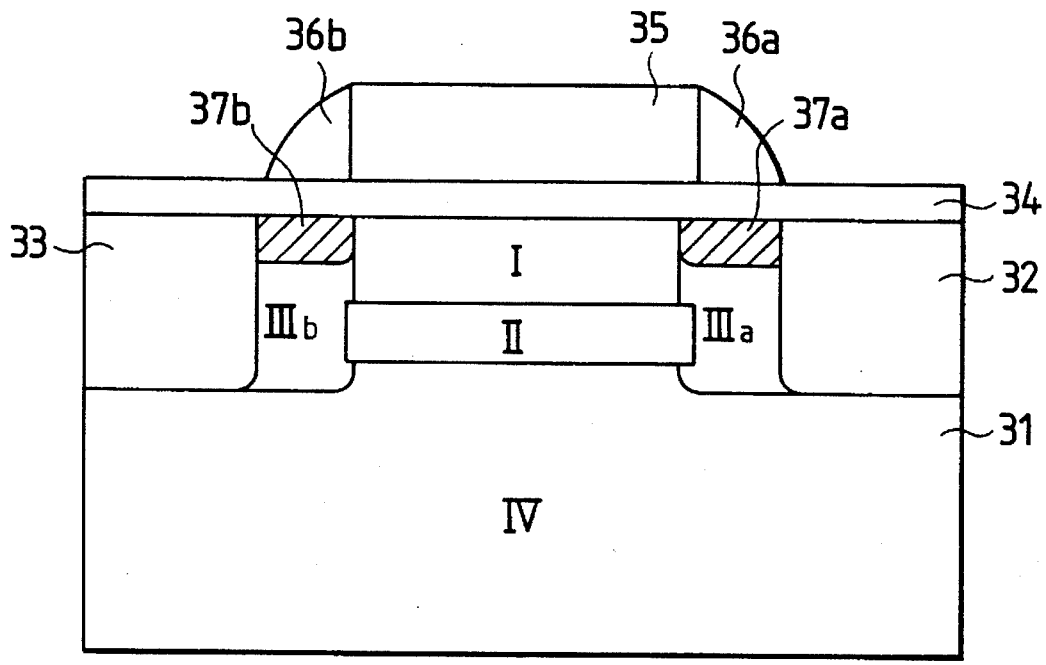
FIG. 42 is a sectional view of the semiconductor device taken along the line A'—A' in FIG. 41.

As shown in FIG. 42, the MOSFET includes a substrate 31 formed with a source region 32 and a drain region 33. The source region 32 and the drain region 33 are separated from each other by a plurality of regions I, II, IIIa, IIIb, 37a, and 37b extending on the substrate 31. The substrate 31 forms a region IV. The regions 37a and 37b are designed to provide an LDD structure.

The region I is sandwiched between the LDD regions 37a and 37b, and also between the regions IIIa and IIIb. The region II extends immediately below the region I, and aligns with the region I along a vertical direction (depth direction). The region II is separated from the source region 32 and the drain region 33 by the regions IIIa and IIIb respectively. In other words, the region IIIa extends between the source region 32 and the region II while the region IIIb extends between the drain region 33 and the region II. The LDD region 37a extends between the region I and the source region 32. The LDD region 37b extends between the region I and the drain region 33. The region IIIa extends immediately below the LDD region 37a. The region IIIb extends immediately below the LDD region 37b. The region IV extends immediately below the region II, the regions IIIa and IIIb, the source region 32, and the drain region 33.

The source region 32, the region I, the drain region 33, and the LDD regions 37a and 37b are coated with the gate insulating film 34. In other words, the gate insulating film 34 extends immediately above the source region 32, the region I, the drain region 33, and the LDD regions 37a and 37b. In FIG. 42, the gate electrode 35 extends on the gate insulating film 34, and aligns with the regions I and II along a vertical direction (depth direction). Nonconductive side spacers 36a and 36b provided on the gate insulating film 34 extend along opposite sides of the gate electrode 35 respectively. The LDD regions 37a and 37b are located below the side spacers 36a and 36b respectively.

The region IV, that is, the substrate 31, is of a first conduction type. The source region 32 and the drain region 33 are of a second conduction type opposite to the first conduction type. The region I is of the first conduction type. The region II is of the second conduction type. The region IIIa and IIIb are of the first conduction type. The LDD regions 37a and 37b are of the second conduction type. In cases where the substrate 31 or the region IV is of the p-type, the regions I, IIIa, and IIIb are of the p-type while the region II, the source region 32, the drain region 33, and the LDD regions 37a and 37b are of the n-type. In cases where the substrate 31 or the region IV is of the n-type, the regions I, IIIa, and IIIb are of the n-type while the region II, the source region 32, the drain region 33, and the LDD regions 37a and 37b are of the p-type.

A central portion of the region I has a width W1 along a depth direction. The presence of a gate bias provides a depletion layer, the width of which along the depth direction is denoted by Wg. The pn junction between the regions I and II provides a depletion layer in the region I, and the width of this depletion layer along the depth direction is denoted by Wj1a. The depth-direction width W1 of the region I is set smaller than the sum of the depletion layer widths Wg and Wj1a. Thus, there is a relation as "W1<Wg+Wj1a".

The region II has a width W2 along the depth direction. The pn junction between the regions I and II provides a depletion layer in the region II, and the width of this depletion layer along the depth direction is denoted by Wj1b. The pn junction between the regions II and IV provides a depletion layer, the width of which along the depth direction is denoted by Wj2. The depth-direction width W2 of the region II is set smaller than the sum of the depletion layer widths Wj1b and Wj2. Thus, there is a relation as "W2<Wj1b+Wj2".

The regions IIIa and IIIb have a width W3 along the depth direction. It is preferable that the depth-direction width W3 of the regions IIIa and IIIb is set greater than the depth-direction width W2 of the region II. Thus, in this case, there is a relation as "W3>W2".

The regions IIIa and IIIb have a width W13 along a lateral direction (horizontal direction). Regarding the region II, the source region 32 provides a depletion layer, the width of which along the lateral direction is denoted by Ws. The junctions among the regions II, IIIa, and IIIb provide depletion layers, the width of which along the lateral direction is denoted by Wj3. The lateral-direction width W13 of the regions IIIa and IIIb is set greater than the sum of the depletion layer widths Ws and Wj3. Thus, there is a relation as "W13>Ws+Wj3".

It is preferable that the impurity concentration (impurity density) N4 in the region IV is set smaller than the impurity concentrations N1, N2, and N3 in the respective regions I, II, and IIIa (and IIIb). Thus, there is a relation as "N4<N1, N2, N3".

During operation of the MOSFET, the region I undergoes an inversion and forms a channel region for conducting carriers. The threshold voltage of the MOSFET can be adjusted according to the impurity concentration in the region I.

The region II connects with the region I via a pn junction, which depletes the region I. The region II connects with the region IV (substrate 31) via a pn junction, which depletes a surface portion of the region IV. The pn junction among the regions I, II, and IV also depletes the region II. Accordingly, when a given potential is applied to the gate electrode 35, the region II helps the depletion. Thus, the region II reduces a virtual capacitance as seen from the gate electrode 25. In addition, the region II decreases the threshold voltage of the MOSFET.

The region IIIb blocks the spread of a depletion layer from the drain region 33, thereby preventing the establishment of conduction (continuity) between the drain region 33 and the region II. The region IIIa blocks the spread of a depletion layer from the source region 32, thereby preventing the establishment of conduction (continuity) between the source region 32 and the region II. As a result, the regions IIIa and IIIb prevent the punch through phenomenon, that is, the establishment of conduction (continuity) between the source region 32 and the drain region 33. In addition, the regions IIIa and IIIb electrically connect the region I and the region IV with each other, and hence stabilizes a potential in the region I.

The impurity concentration in the region IV determines the capacitances of the source region 32 and the drain region 33. Since the prevention of the punch through phenomenon is implemented by the regions IIIa and IIIb, the impurity concentration in the region IV can be chosen without considering the prevention of the punch through phenomenon. It is preferable that the impurity concentration in the region IV is set to a small value to provide smaller capacitances of the source region 32 and the drain region 33.

Figure 43:
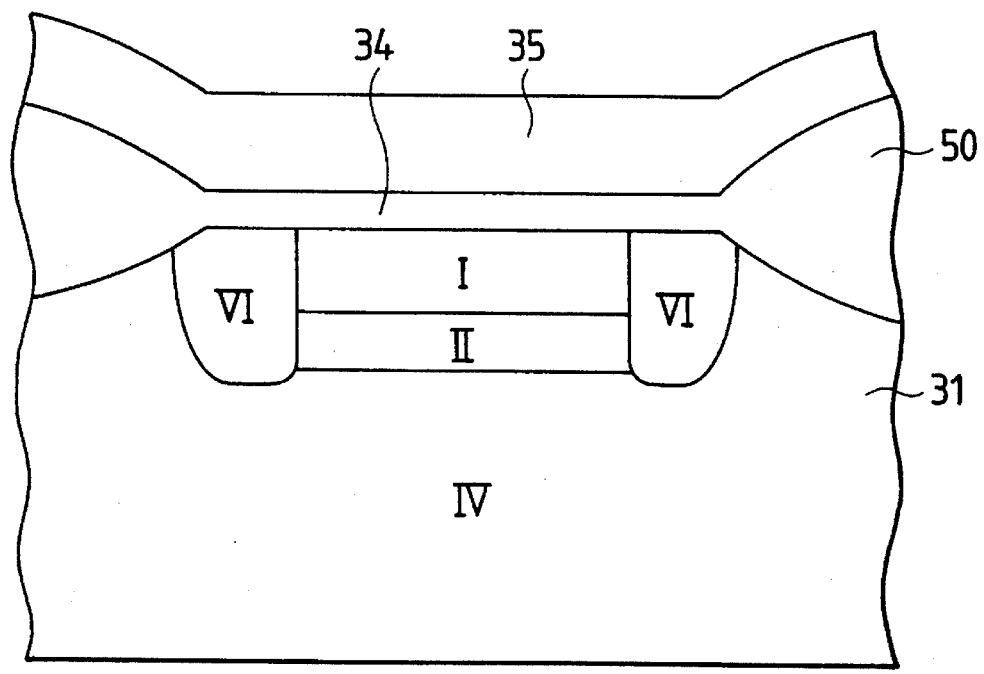
FIG. 43 is a sectional view of the semiconductor device taken along the line B—B in FIG. 41.

With reference to FIGS. 41 and 43, edges of the MOSFET near the field oxide film 50 have a region VI of, for example, a loop configuration. It should be noted that the reference character "VI" is used here since the reference characters "Va" and "Vb" have already been used in the description of the embodiment of FIG. 23. The region VI extends between the region I and the field oxide film 50, and between the region II and the field oxide film 50. In FIG. 43, the regions I and II are sandwiched between opposite portions of the region VI. The region VI extends below the gate insulating film 34 but above the region IV. The region VI has the same conduction type as that of the region I. The region VI has an impurity concentration greater than that in the region I. In other words, the region VI has a conductivity higher than that of the region I. The region VI prevents the occurrence of a leak current.

Figure 44:
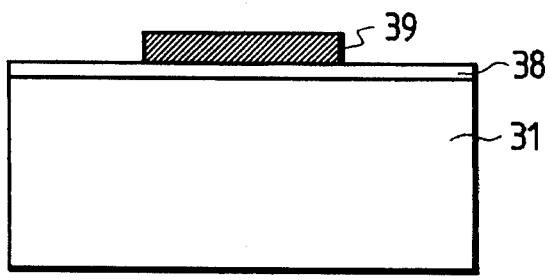
FIGS. 44, 45, 46, 47, and 48 are sectional diagrams of a semiconductor wafer in different states which occur during fabrication of the semiconductor device of FIGS. 41–43, and sectional views of the semiconductor device taken along the line A—A in FIG. 41.

The MOSFET of FIGS. 41–43 is fabricated as follows. With reference to FIG. 44, a p-type substrate 31 is prepared which will form a region IV. The substrate 31 has an impurity concentration (impurity density) of, for example, $1.5 \times 10^{16}$ cm$^{-3}$. A buffer oxide film 38 is formed on a surface of the substrate 31. An Si$_3$N$_4$ film 39 is superposed on the buffer oxide film 38. The Si$_3$N$_4$ film 39 is removed from areas where a field oxide film 50 should be made at a later stage.

Impurity ions corresponding to a p-type, for example, boron (B) ions, are implanted into the substrate 31 while the remaining Si$_3$N$_4$ film 39 is used as a mask. During this ion implantation, a dose is set to a relatively great value. Therefore, a p-type region is formed in a portion of the substrate 31 which extends outward of the remaining Si$_3$N$_4$ film 39. The p-type region will form a region VI (see FIG. 43).

Figure 45:
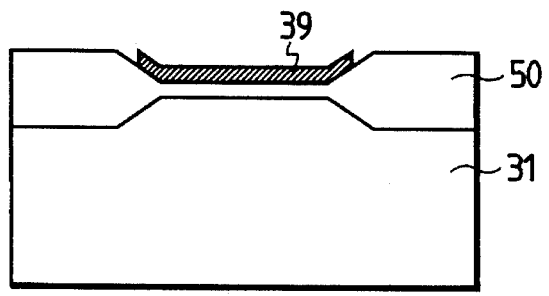
Figure 46:
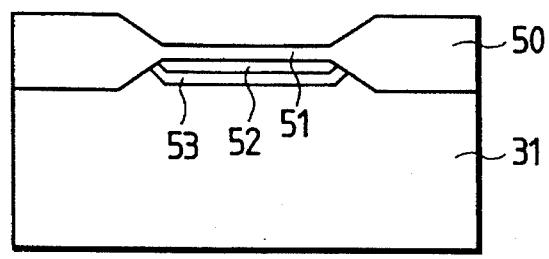

Then, as shown in FIG. 45, a field oxide film 50 is formed on the substrate 31 by a LOCOS (local oxidation of silicon) process while the remaining Si$_3$N$_4$ film 39 keeps exposed. Subsequently, the remaining Si$_3$N$_4$ film 39 and the buffer oxide film 38 are removed, and a sacrifice oxide film 51 is formed on the substrate 31 as shown in FIG. 46.

Boron (B) ions are implanted into the substrate 31 via the sacrifice oxide film 51 while being accelerated at, for example, 25 KeV. The boron ion dose is equal to, for example, $4 \times 10^{12}$ cm$^{-2}$ or $6.8 \times 10^{12}$ cm$^{-2}$. In addition, phosphorus (P) ions are implanted into the substrate 31 via the sacrifice oxide film 51 while being accelerated at, for example, 105 KeV or 120 KeV. The phosphorus ion dose is equal to, for example, $6.3 \times 10^{12}$ cm$^{-2}$. As a result, a B-doped layer 52 is formed immediately below the sacrifice oxide film 51, and a P-doped layer 53 is formed immediately below the B-doped layer 52. A heating process on the implanted B and P ions will be executed later. The B-doped layer 52 and the P-doped layer 53 will form a region I and a region II respectively.

Figure 47:
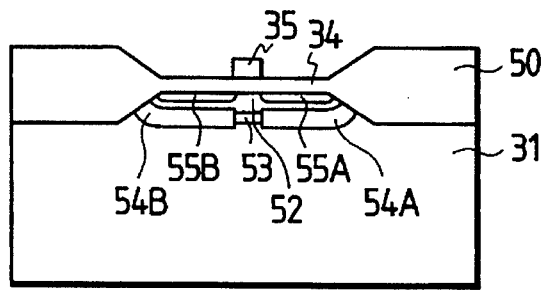

After the ion implantations, the sacrifice oxide film 51 is replaced by a gate insulating film 34 made of an oxide as shown in FIG. 47. A thin film of polycrystalline silicon is formed on the gate insulting film 34. The polycrystalline silicon film is etched into a gate electrode 35 of an n-type.

Subsequently, while the gate electrode 35 is used as a mask, boron (B) ions are implanted via the gate insulating film 34 into regions 54A and 54B which contain the P-doped layer 53 and which extend into areas immediately above and below the P-doped layer 53 lying outward of the gate electrode 35. The boron ion implantation is executed under conditions where an acceleration potential is equal to, for example, 40 KeV and a dose is equal to, for example, $5.0 \times 10^{12}$ cm$^{-2}$. A heating process on the implanted boron ions will be executed later. Portions of the regions 54A and 54B will form regions IIIa and IIIb respectively.

While the gate electrode 35 is used as a mask, arsenic (As) ions are implanted via the gate insulating film 34 into regions 55A and 55B in the B-doped layer 52 which extend immediately below the gate insulating film 34 lying outward of the gate electrode 35. The arsenic ion implantation is executed under conditions where an acceleration potential is equal to, for example, 25 KeV and a dose is equal to, for example, $4.0 \times 10^{13}$ cm$^{-2}$. A heating process on the implanted arsenic ions will be executed later. The regions 55A and 55B form layers of an n-type, portions of which will be LDD layers 37a and 37b respectively.

Figure 48:
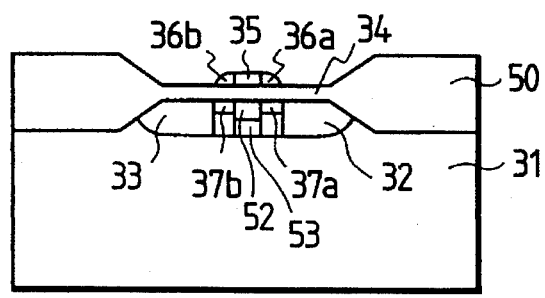

Subsequently, as shown in FIG. 48, side spacers 36a and 36b are formed along opposite sides of the gate electrode 35 respectively. The side spacers 36a and 36b extend on the gate insulating film 34. Specifically, after the arsenic ion implantation, the substrate 31 with the above-indicated regions is coated with an $SiO_2$ film. The $SiO_2$ film is made into the side spacers 36a and 36b by an anisotropic etching process such as an RIE process.

While the gate electrode 35 and the side spacers 36a and 36b are used as a mask, arsenic (As) ions are implanted via the gate insulating film 34 into regions 32 and 33 which contain the regions 55A, 55B, 52, 54A, and 54B lying outward of the gate electrode 35 and the side spacers 36a and 36b. The regions 32 and 33 extend immediately below the gate insulating film 34, and project into deeper portions of the substrate 31. The arsenic ion implantation is executed under conditions where an acceleration potential is equal to, for example, 50 KeV and a dose is equal to, for example, $1 \times 10^{15}$ cm$^{-2}$. During a later stage, a heating process on the implanted arsenic ions will be executed to activate the regions 32 and 33 into a source region and a drain region respectively.

Finally, the substrate 31 with the previously-indicated regions is subjected to a heating process so that the MOSFET of FIGS. 41–43 is completed. An example of conditions of the heating process is that the heating temperature is equal to 900° C. and the heating time is equal to 40 minutes. The B-doped layer 52 remaining below the gate electrode 35 forms a region I shown in FIGS. 42, 43, and 49. The P-doped layer 53 remaining below the gate electrode 35 forms a region II shown in FIGS. 42, 43, and 49. The regions 54A and 54B remaining below the side spacers 36a and 36b form regions IIIa and IIIb (see FIG. 42) respectively. The substrate 31 forms a region 1V shown in FIGS. 42, 43, and 49. The regions 55A and 55B remaining below the side spacers 36a and 36b form LDD regions 37a and 37b (see FIG. 42) respectively. The previously-indicated p-type region forms a region VI shown in FIGS. 43 and 49.

Figure 49:
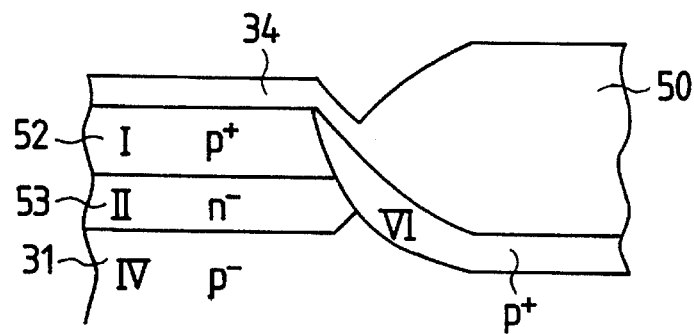
FIG. 49 is a sectional diagram of a portion of the semiconductor device in FIGS. 41–43, and a sectional view of the semiconductor device taken along the line B'—B' in FIG. 41.

As shown in FIG. 49, the region VI extends between the region I and the field oxide film 50, and between the region II and the field oxide film 50.

Ninth Embodiment

A ninth embodiment of this invention relates to another method of fabricating the MOSFET of FIGS. 41–43. The method according to the ninth embodiment is similar to the method in the eighth embodiment except for points indicated later.

Figure 50:
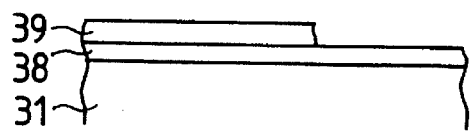
FIGS. 50, 51, 52, 53, 54, and 55 are sectional diagrams of a semiconductor wafer in different states which occur during fabrication of a semiconductor device according to a ninth embodiment of this invention, and sectional views of the semiconductor device taken along the line B'—B' in FIG. 41.

According to the ninth embodiment, as shown in FIG. 50, a p-type substrate 31 is prepared which will form a region IV. A buffer oxide film 38 is formed on a surface of the substrate 31. An $Si_3N_4$ film 39 is superposed on the buffer oxide film 38. The $Si_3N_4$ film 39 is removed from areas where a field oxide film 50 should be made at a later stage.

Figure 51:
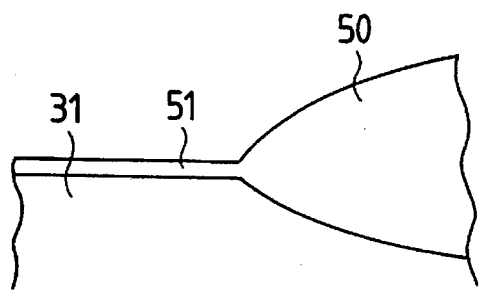

Then, as shown in FIG. 51, a field oxide film 50 is formed on the substrate 31 by a LOCOS (local oxidation of silicon) process while the remaining $Si_3N_4$ film 39 keeps exposed. Subsequently, the remaining $Si_3N_4$ film 39 and the buffer oxide film 38 are removed, and a sacrifice oxide film 51 is formed on the substrate 31 as shown in FIG. 51.

Figure 52:
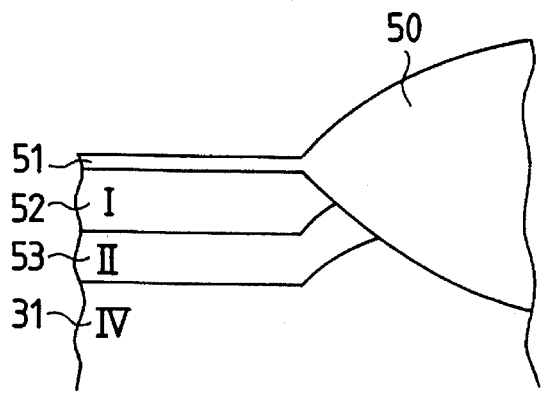

Boron (B) ions are implanted into the substrate 31 via the sacrifice oxide film 51 while being accelerated at, for example, 25 KeV. The boron ion dose is equal to, for example, $4 \times 10^{12}$ cm$^{-2}$ or $6.8 \times 10^{12}$ cm$^{-2}$. In addition, phosphorus (P) ions are implanted into the substrate 31 via the sacrifice oxide film 51 while being accelerated at, for example, 105 KeV or 120 KeV. The phosphorus ion dose is equal to, for example, $6.3 \times 10^{12}$ cm$^{-2}$. Therefore, a B-doped layer 52 is formed immediately below the sacrifice oxide film 51, and a P-doped layer 53 is formed immediately below the B-doped layer 52 as shown in FIG. 52. A heating process on the implanted B and P ions will be executed later. The B-doped layer 52 and the P-doped layer 53 will form a region I and a region II respectively. As shown in FIG. 52, below edges of the field oxide film 50, the B-doped layer 52 and the P-doped layer 53 extend in smaller-depth areas according to the thickness of the field oxide film 50.

Figure 53:
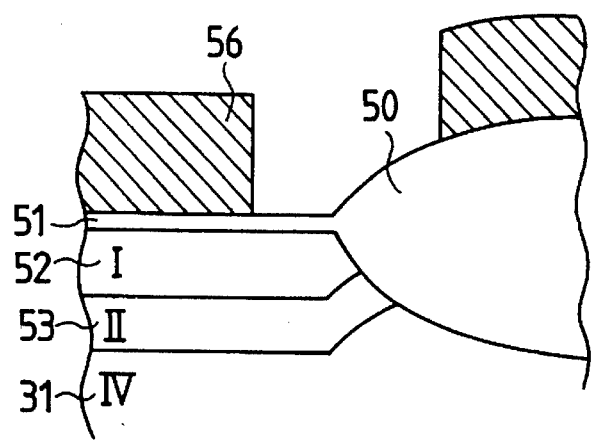
Figure 54:
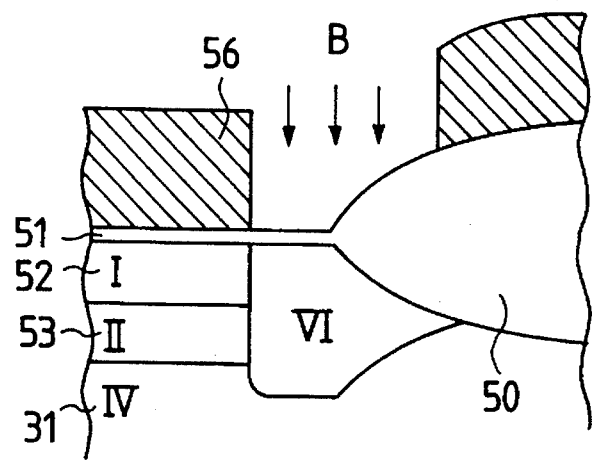

Subsequently, as shown in FIG. 53, a layer 56 of resist is formed on the sacrifice oxide film 51 and the field oxide film 50. The resist layer 56 has a window which exposes edges of the sacrifice oxide film 51 and the field oxide film 50. As shown in FIG. 54, impurity ions corresponding to a p-type, for example, boron (B) ions, are implanted into the substrate 31 via the window through the resist layer 56. During this ion implantation, a dose is set to a relatively great value. Therefore, a p-type region 57 is formed in a portion of the substrate 31 which extends below the window through the resist layer 56. The p-type region 57 will form a region VI extending between a region I and the field oxide film 50, and between a region II and the field oxide film 50.

Figure 55:
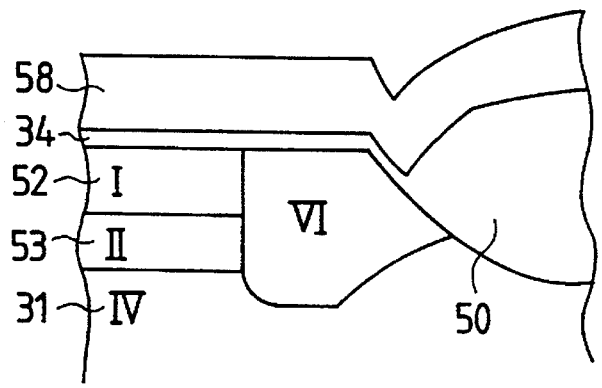

Then, the resist layer 56 is removed. After the removal of the resist layer 56, the sacrifice oxide film 51 is replaced by a gate insulating film 34 made of an oxide as shown in FIG. 55. A thin film 58 of polycrystalline silicon is formed on the gate insulting film 34. The polycrystalline silicon film 58 is etched into a gate electrode 35 (see FIG. 42) of an n-type.

Subsequently, processes similar to those in the method according to the eighth embodiment are executed to complete the MOSFET.

Tenth Embodiment

A tenth embodiment of this invention relates to still another method of fabricating the MOSFET of FIGS. 41–43. The method according to the tenth embodiment is similar to the method in the eighth embodiment except for points indicated later.

Figure 56:
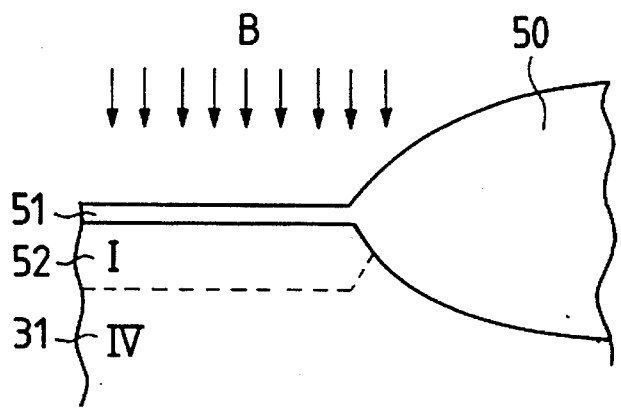
FIGS. 56, 57, and 58 are sectional diagrams of a semiconductor wafer in different states which occur during fabrication of a semiconductor device according to a tenth embodiment of this invention, and sectional views of the semiconductor device taken along the line B'—B' in FIG. 41.

According to the tenth embodiment, after a field oxide film 50 is formed on a p-type substrate 31, boron (B) ions are implanted into the substrate 31 via a sacrifice oxide film 51 as shown in FIG. 56. Therefore, a B-doped layer 52 is formed immediately below the sacrifice oxide film 51. A major part of the B-doped layer 52 will form a region I.

Figure 57:
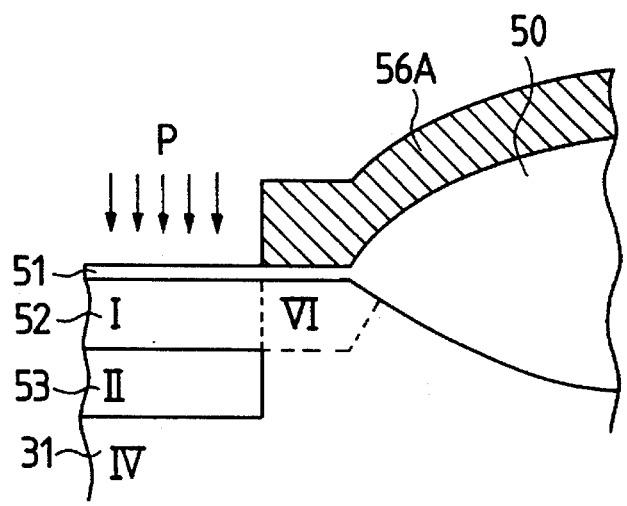

Subsequently, as shown in FIG. 57, a layer 56A of resist is formed on the whole of the field oxide film 50 and edges of the sacrifice oxide film 51. The resist layer 56A has a window which exposes the sacrifice oxide film 51 except the edges thereof. While the resist layer 56A is used as a mask, phosphorus (P) ions are implanted into the substrate 31 via the sacrifice oxide film 51. As a result, a P-doped layer 53 is formed immediately below the B-doped layer 52. In this case, the mask holds unchanged a p-type portion of the substrate 31 which extends between the P-doped layer 53 and the field oxide film 50. Thus, the P-doped layer 53 is separated from the field oxide film 50 by the p-type portion of the substrate 31. The P-doped layer 53 will form a region II.

The B-doped layer 52 has an edge which projects outward of the P-doped layer 53, and which extends directly below an edge of the resist layer (mask) 56A. Since the edge of the B-doped layer 52 is free from the implantation of P ions due to the function of the mask, the net acceptor concentration in the edge of the B-doped layer 52 is higher than that in the other portion of the B-doped layer 52. Thus, the effective impurity concentration in the edge of the B-doped layer 52 is higher than that in the other portion of the B-doped layer 52. The edge of the B-doped layer 52 will form a region VI.

Figure 58:
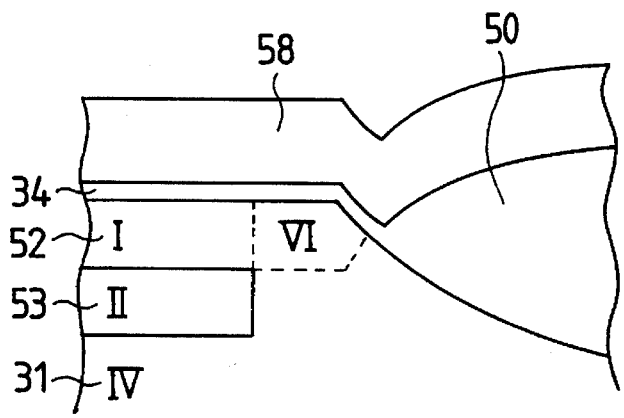

Subsequently, the resist layer 56A is removed, and the sacrifice oxide film 51 is replaced by a gate insulating film 34 as shown in FIG. 58. A thin film 58 of polycrystalline silicon is formed on the gate insulting film 34. The polycrystalline silicon film 58 is etched into a gate electrode 35 (see FIG. 42) of an n-type.

Then, processes similar to those in the method according to the eighth embodiment are executed to complete the MOSFET. As shown in FIG. 58, the whole of the region I has an approximately uniform thickness, and hence it is possible to prevent the occurrence of a reduction in a threshold voltage at a local area. This configuration of the region I is effective in suppressing a leak current.

Figure 59:
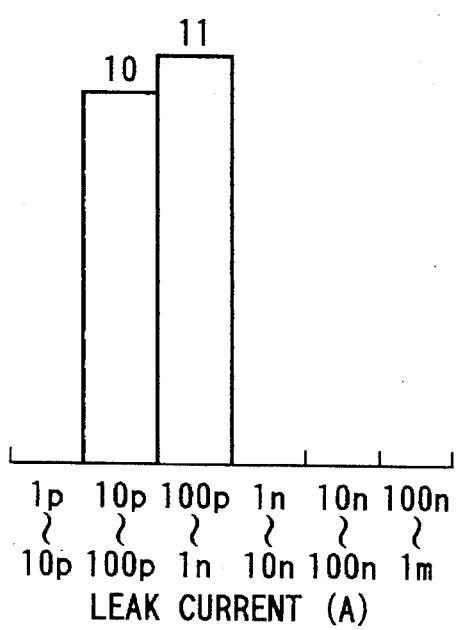
FIG. 59 is a diagram of a distribution of leak currents in samples of the semiconductor device according to the tenth embodiment.
Figure 60:
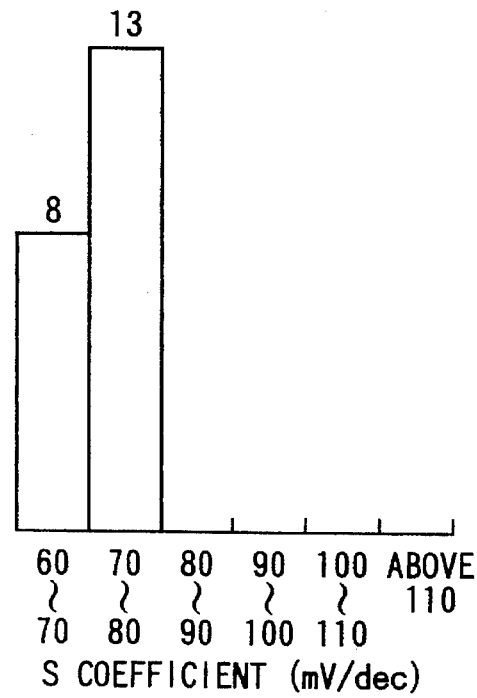
FIG. 60 is a diagram of a distribution of S coefficients (S factors) in the samples of the semiconductor device according to the tenth embodiment.

A plurality of samples of the MOSFET were made by the method in this embodiment. In each of the samples of the MOSFET, a P-doped layer 53 was separated from a field oxide film 50 by a lateral distance of 2 µm. FIG. 59 shows a distribution of leak currents in the samples of the MOSFET. FIG. 60 shows a distribution of S coefficients (S factors) in the samples of the MOSFET. As shown in FIGS. 59 and 60, variations in the leak current and the S coefficient between the samples of the MOSFET were adequately small.

Figure 61:
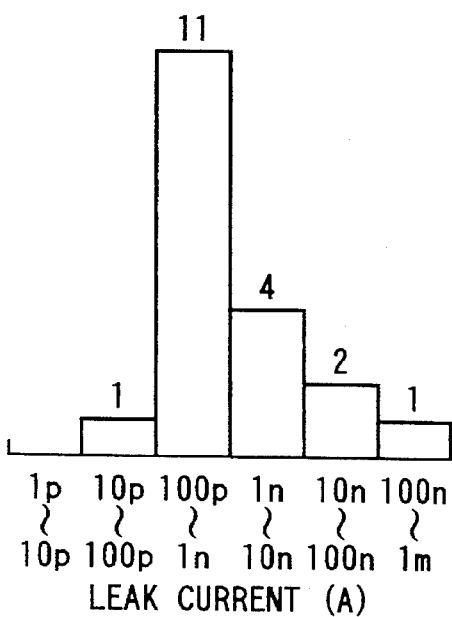
FIG. 61 is a diagram of a distribution of leak currents of MOSFET's produced by the prior art.
Figure 62:
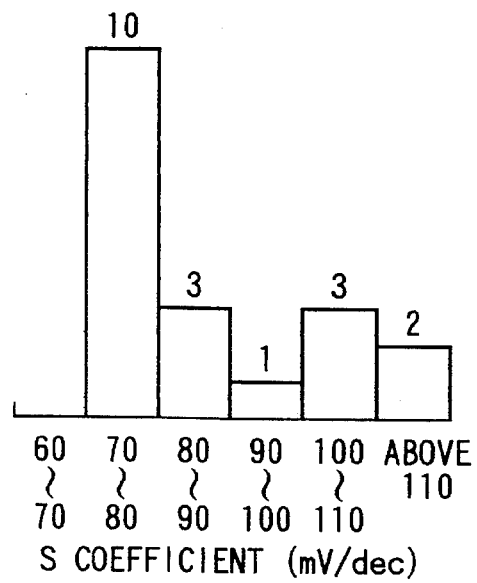
FIG. 62 is a diagram of a distribution of S coefficients (S factors) of MOSFET's produced by the prior art.

FIG. 61 corresponds to FIG. 59, and shows a distribution of leak currents of samples of a MOSFET produced by a prior-art method. FIG. 62 corresponds to FIG. 60, and shows a distribution of S coefficients (S factors) of the samples of the MOSFET produced by the prior-art method. As understood from the comparison among FIGS. 59–62, the method in this embodiment is advantageous over the prior-art method.

What is claimed is:

1. A semiconductor device comprising:

a substrate having a first conduction type;

a gate insulating film provided on the substrate;

a gate electrode formed on the gate insulating film;

a source region provided on the substrate and having a second conduction type different from the first conduction type;

a drain region provided on the substrate and having the second conduction type;

wherein the source region and the drain region extend below the gate insulating film and are located at respective sides of the gate electrode;

a first region provided on the substrate and having the first conduction type, the first region extending below the gate insulating film;

a second region provided on the substrate and having the second conduction type, the second region extending below the first region and being separated from the gate insulating film by the first region, the second region connecting with the first region via a pn junction; and third regions provided on the substrate and having the first conduction type, the third regions connecting with the second region via respective pn junctions, wherein a first one of the third regions extends between the second region and the source region and separates the second region from the source region, and a second one of the third regions extends between the second region and the drain region and separates the second region from the drain region;

wherein the first region has a depth-direction width which is smaller than a sum of a depth-direction width of a depletion layer caused by the pn junction with the second region and a depth-direction width of a depletion layer caused by application of a voltage to the gate electrode, and wherein the third regions have a lateral-direction width which is greater than a sum of a lateral-direction width of a depletion layer caused by the source region and a lateral-direction width of a depletion layer caused by the pn junctions with the second region.

2. The semiconductor device of claim 1, wherein the third regions have an impurity concentration higher than an impurity concentration in the second region.

3. The semiconductor device of claim 1, wherein the substrate has an impurity concentration lower than an impurity concentration in the third regions, and a depletion layer caused by the drain region reaches the substrate.

4. A semiconductor device comprising:

a substrate having a first conduction type;

a gate insulating film provided on the substrate;

a gate electrode formed on the gate insulating film;

a source region provided on the substrate and having a second conduction type different from the first conduction type;

a drain region provided on the substrate and having the second conduction type;

wherein the source region and the drain region extend below the gate insulating film and are located at respective sides of the gate electrode;

a first region provided on the substrate and having the first conduction type, the first region extending below the gate insulating film;

a second region provided on the substrate and having the second conduction type, the second region extending below the first region and being separated from the gate insulating film by the first region, the second region connecting with the first region via a pn junction;

third regions provided on the substrate and having the first conduction type, the third regions connecting with the second region via respective pn junctions, wherein a first one of the third regions extends between the second region and the source region and separates the second region from the source region, and a second one of the third regions extends between the second region and the drain region and separates the second region from the drain region;

a fourth region formed by the substrate; and fifth regions provided on the substrate and having the second conduction type, the fifth regions having an impurity concentration lower than an impurity concentration in the source region and the drain region, wherein a first one of the fifth regions extends between the fourth region and the source region, and a second one of the fifth regions extends between the fourth region and the drain region;

wherein the first region has a depth-direction width which is smaller than a sum of a depth-direction width of a depletion layer caused by the pn junction with the second region and a depth-direction width of a depletion layer caused by application of a voltage to the gate electrode, and wherein the third regions have a lateral-direction width which is greater than a sum of a lateral-direction width of a depletion layer caused by the drain region and a lateral-direction width of a depletion layer caused by the pn junctions with the second region.

5. A semiconductor device comprising:

a substrate having a first conduction type;

a gate insulating film provided on the substrate;

a gate electrode formed on the gate insulating film;

a source region provided on the substrate and having a second conduction type different from the first conduction type;

a drain region provided on the substrate and having the second conduction type;

wherein the source region and the drain region extend below the gate insulating film and are located at respective sides of the gate electrode;

a first region provided on the substrate and having the first conduction type, the first region extending below the gate insulating film;

a second region provided on the substrate and having the second conduction type, the second region extending below the first region and being separated from the gate insulating film by the first region, the second region connecting with the first region via a pn junction;

third regions provided on the substrate and having the first conduction type, the third regions connecting with the second region via respective pn junctions, wherein a first one of the third regions extends between the second region and the source region and separates the second region from the source region, and a second one of the third regions extends between the second region and the drain region and separates the second region from the drain region; and a fourth region formed by the substrate and connecting with the second region via a pn junction;

wherein the first region has a depth-direction width which is smaller than a sum of a depth-direction width of a depletion layer caused by the pn junction with the second region and a depth-direction width of a depletion layer caused by application of a voltage to the gate electrode, wherein the second region has a depth-direction width which is smaller than a sum of a depth-direction width of a depletion layer caused in the second region by the pn junction with the first region and a depth-direction width of a depletion layer caused by the pn junction with the fourth region, and wherein the third regions have a lateral-direction width which is greater than a sum of a lateral-direction width depletion layer caused by the source region and a lateral-direction width of a depletion layer caused by the pn junctions with the second region.

6. A semiconductor device comprising:

a substrate having a first conduction type;

a gate insulating film provided on the substrate;

a gate electrode formed on the gate insulating film;

a source region provided on the substrate and having a second conduction type different from the first conduction type;

a drain region provided on the substrate and having the second conduction type;

wherein the source region and the drain region extend below the gate insulating film and are located at respective sides of the gate electrode;

a first region provided on the substrate and having the first conduction type, the first region extending below the gate insulating film;

a second region provided on the substrate and having the second conduction type, the second region extending below the first region and being separated from the gate insulating film by the first region, the second region connecting with the first region via a pn junction;

third regions provided on the substrate and having the first conduction type, the third regions connecting with the second region via respective pn junctions, wherein a first one of the third regions extends between the second region and the source region and separates the second region from the source region, and a second one of the third regions extends between the second region and the drain region and separates the second region from the drain region; and LDD regions provided on the substrate and having the second conduction type, the LDD regions having an impurity concentration lower than an impurity concentration in the source region and the drain region, wherein a first one of the LDD regions extends between the first region and the source region, and a second one of the LDD regions extends between the first region and the drain region;

wherein the first region has a depth-direction width which is smaller than a sum of a depth-direction width of a depletion layer caused by the pn junction with the second region and a depth-direction width of a depletion layer caused by application of a voltage to the gate electrode, and wherein the third regions have a lateral-direction width which is greater than a sum of a lateral-direction width of a depletion layer caused by the drain region and a lateral-direction width of a depletion layer caused by the pn junctions with the second region.

7. A semiconductor device comprising:

a substrate having a first conduction type;

a gate insulating film provided on the substrate;

a gate electrode formed on the gate insulating film;

a source region provided on the substrate and having a second conduction type different from the first conduction type;

a drain region provided on the substrate and having the second conduction type;

wherein the source region and the drain region extend below the gate insulating film and are located at respective sides of the gate electrode;

a first region provided on the substrate and having the first conduction type, the first region extending below the gate insulating film;

a second region provided on the substrate and having the second conduction type, the second region extending below the first region and being separated from the gate insulating film by the first region, the second region connecting with the first region via a pn junction;

third regions provided on the substrate and having the first conduction type, the third regions connecting with the second region via respective pn junctions, wherein a first one of the third regions extends between the second region and the source region and separates the second region from the source region, and a second one of the third regions extends between the second region and the drain region and separates the second region from the drain region;

a second insulating film provided on the substrate and surrounding an area containing the gate insulating film, the gate electrode, the source region, the drain region, the first region, the second region, and the third regions to provide an isolation from a neighboring device; and a fourth region provided on the substrate and extending between the first region and the second insulating film, the fourth region having a conductivity higher than a conductivity of the first region;

wherein the first region has a depth-direction width which is smaller than a sum of a depth-direction width of a depletion layer caused by the pn junction with the second region and a depth-direction width of a depletion layer caused by application of a voltage to the gate electrode, and wherein the third regions have a lateral-direction width which is greater than a sum of a lateral-direction width of a depletion layer caused by the drain region and a lateral-direction width of a depletion layer caused by the pn junctions with the second region.

* * * * *